United States Patent
Anthony et al.

(10) Patent No.: US 6,567,301 B2
(45) Date of Patent: May 20, 2003

(54) ONE-TIME PROGRAMMABLE UNIT MEMORY CELL BASED ON VERTICALLY ORIENTED FUSE AND DIODE AND ONE-TIME PROGRAMMABLE MEMORY USING THE SAME

(75) Inventors: Thomas C. Anthony, Sunnyvale, CA (US); Lung T. Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/924,500

(22) Filed: Aug. 9, 2001

(65) Prior Publication Data

US 2003/0031047 A1 Feb. 13, 2003

(51) Int. Cl.$^7$ ............................ G11C 11/36; G11C 7/00
(52) U.S. Cl. ..................... 365/175; 365/225.7; 365/115
(58) Field of Search .............................. 365/175, 225.7, 365/230.06, 105, 163, 243, 115

(56) References Cited

U.S. PATENT DOCUMENTS 5,536,968 A * 7/1996 Crafts et al. ................ 257/258
6,034,882 A * 3/2000 Johnson et al. ............. 365/103
6,351,406 B1 * 2/2002 Johnson et al. ............. 365/103
6,385,075 B1 * 5/2002 Taussig et al. .............. 365/105

* cited by examiner

Primary Examiner—Thong Le

(57) ABSTRACT

A one-time programmable unit memory cell includes a vertically oriented fuse and an diode in series. Within the vertically oriented fuse, the current flow is substantially vertical, i.e. perpendicular to the plane of the substrate. Also, the vertically oriented fuse is placed between top and bottom conductors. This vertical placement of the elements helps to increase density of memory devices built using these unit cells. Also, vertically oriented fuses consume very little lateral area, which helps the density even further. The unit memory cell has two states, an initial state and a written (programmed) state. In the initial state, a resistance of the cell is finite because the vertically oriented fuse is left intact. In the written state, the resistance is infinite because the fuse is blown open. The cell may be programmed by applying a critical voltage across the cell enough to cause the fuse to become open. The states are detected by applying a read voltage across the memory cell. If the is not programmed, then a measurable amount flows. Otherwise, no current flows due to the open circuit. A cross-point memory array may be formed with unit memory cells formed at each cross point. With addition of read and write circuitry, the memory array maybe used as memory. However, multiple arrays may be stacked to form high density memory devices.

29 Claims, 22 Drawing Sheets

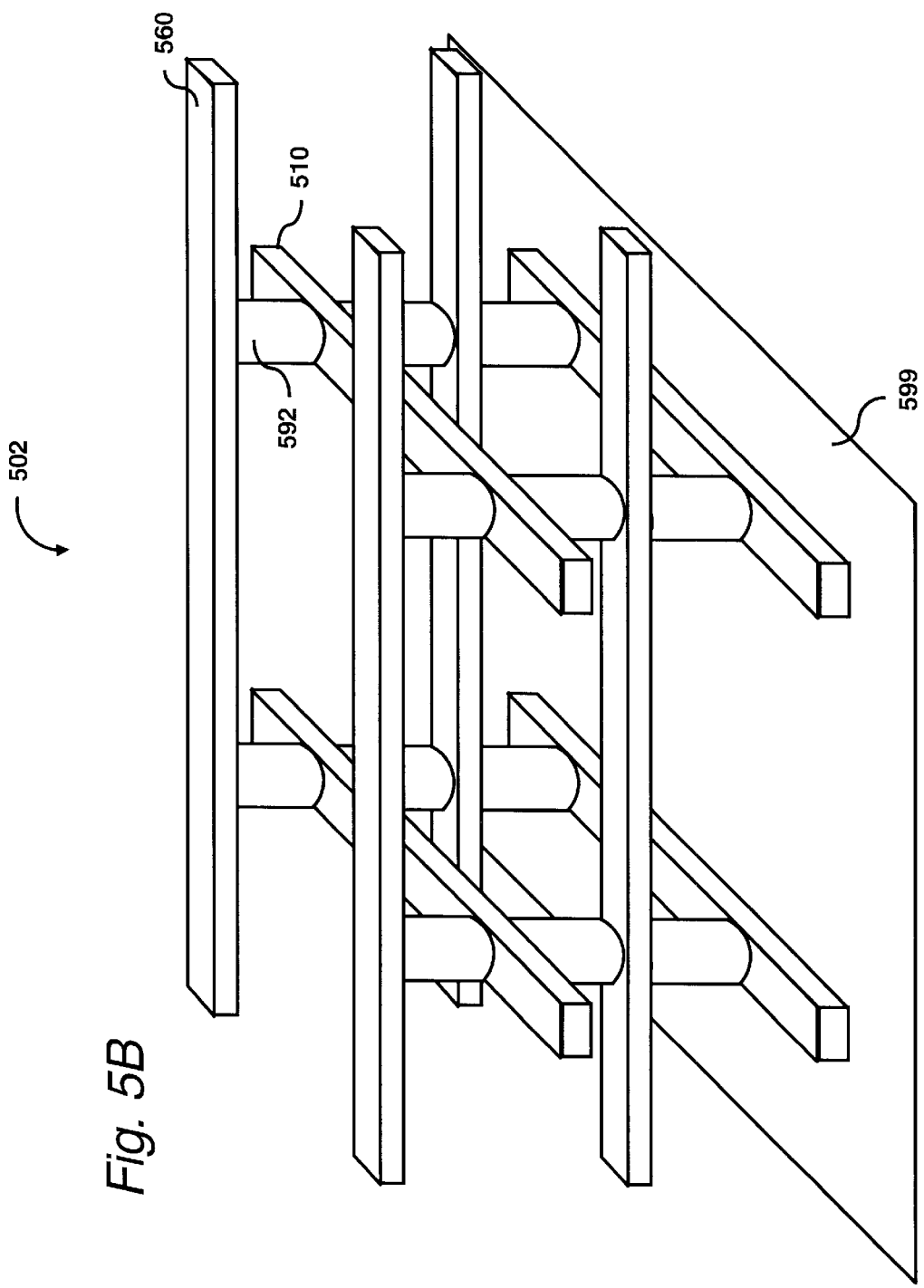

ONE-TIME PROGRAMMABLE UNIT MEMORY CELL BASED ON VERTICALLY ORIENTED FUSE AND DIODE AND ONE-TIME PROGRAMMABLE MEMORY USING THE SAME

RELATED APPLICATIONS

The following applications of the common assignee may contain some common disclosure and may relate to the present invention:

U.S. patent application Ser. No. 09/964,770, entitled "VERTICALLY ORIENTED NANO-FUSE AND NANO-RESISTOR CIRCUIT ELEMENTS";

U.S. patent application Ser. No. 09/964,768, entitled "ONE-TIME PROGRAMMABLE FUSE/ANTI-FUSE COMBINATION MEMORY CELL"; and U.S. patent application Ser. No. 09/924,577, entitled "ONE-TIME PROGRAMMABLE MEMORY USING FUSE/DIODE AND VERTICALLY ORIENTED FUSE UNIT MEMORY CELLS";

FIELD OF THE INVENTION

This invention relates generally to programmable memory cells and memory devices using programmable memory cells. More particularly, the invention relates to a one-time programmable unit memory cells and memory devices using the one-time programmable unit memory cells.

BACKGROUND OF THE INVENTION

The demand for semiconductor devices has increased dramatically in recent years. One can readily observe the pervasiveness of consumer electronic devices in the modem world. Most or all of the consumer electronic devices are made possible because of developments in semiconductor devices. As the consumer electronic devices become smaller, more sophisticated, and less expensive, increasingly higher densities of the semiconductor devices, including memories, are demanded at a lower cost in today's market place.

In the field of memories, the demand for ever increasing densities and lower cost is particularly true, especially for the non-volatile memories, i.e., those memories that do not lose data even when power is not supplied.

A non-volatile memory may be a one time programmable ("OTP") or reprogrammable. As the name suggests, OTP memory is programmed once, and it is permanent for all practical purposes. Most OTP memories can be categorized into four basic types: 1) anti-fuse, 2) fuse, 3) charge storage (EPROM), and 4) mask ROM.

Programmable elements based on an anti-fuse typically rely on breakdown of metalin-sulator-metal or diode structures to create the two resistance states. Programming voltages in excess of 10 V are generally required. In addition, the current required for anti-fuse breakdown can be large, which leads to large drive transistors. If used as a memory cell, an access transistor is typically included in the memory cell.

Memory cells based on a fuse storage element are not widely used due to the large cell size. A planar fuse requires a minimum area of $8\lambda^2$ (where $\lambda$ is the minimum photolithographic feature size), since a contact region is needed on each end of the fuse. Generally the fuse is even larger than $8\lambda^2$ to provide a more readily programmed element. As for the anti-fuse, the programming current can be large, which leads to large drive transistors as mentioned above. Adding an access transistor increases the minimum cell size even further.

In the case of EPROM, programming the bit requires a high write voltage to transfer charge from the substrate to the floating gate of the memory cell by Fowler-Nordheim electron tunneling. Write speed is limited by the tunneling current density. EPROM is unique within the OTP memory family in that it can be reprogrammed, but it has to be erased first by exposing the memory array to a ultra-violet light source. This procedure is not easily implemented and the entire memory is erased.

A mask read only memory ("mask ROM") is a memory that is programmed at the time of fabrication, and thus is a type of an OTP memory. Mask ROM is relatively less complex since the circuitry to enable writability is not needed, and thus is less costly when compared to other OTP memories. Because the programming is part of the fabrication process, the mask ROM cannot be "field programmed", i.e., programmed by the purchaser to fit the particular needs of the purchaser. In other words, mask ROMs do not provide the flexibility of field programmability. Also, unless the mask ROMs are manufactured in bulk, cost savings cannot generally be realized.

Existing OTP memory technologies described above are based on cell sizes considerably larger than $4\lambda^2$, the minimum cell size for a cross-point memory. In addition, in each case the memory cell consists of a single plane of memory elements constructed on a single crystal silicon substrate, with sense and programming electronics located around the periphery of the memory array. Since single crystal silicon transistors are integral components of the memory elements in the foregoing technologies, stacking memory layers on top of one another to increase density is not possible. Consequently, high density, low cost OTP memories are difficult to fabricate.

SUMMARY OF THE INVENTION

In accordance with an aspect of the present invention, a one-time programmable memory cell may include a top conductor extending in a first direction and a bottom conductor extending in a second direction. The top and bottom conductors define a cross-point at an intersection between the two conductors. The top and bottom conductors are electrically connected. The memory cell may also include a vertically oriented fuse formed in the cross-point between the top and bottom conductors. The fuse may also have electrical connectivity with the top and bottom conductors. Further, the memory cell may include a diode formed in electrical series with the vertically oriented fuse. The diode may also be formed between the top and bottom conductors.

In accordance with another aspect of the principles of the invention, a method of fabricating a one-time programmable memory cell may include forming a top conductor extending in a first direction and forming a bottom conductor extending in a second direction so as to define a cross-point at an intersection between the top and bottom conductors. The top and bottom conductors may have electrical connectivity with each other. The method may also included forming a vertically oriented fuse in the cross-point between the top and bottom conductors. The method may further included forming a diode in electrical series with the vertically oriented fuse.

In accordance with a further aspect of the present invention, a one-time programmable memory device may include one or more memory arrays. Each memory array may include one or more row conductors extending in a row direction and one or more column conductors extending in a column direction such that a cross-point is formed at each intersection between the row and column conductors. At each cross point, a state element may be formed. The state element may include a vertically oriented fuse and a diode in series with each other.

Certain advantages follow from certain embodiments of the invention. For example, the size of the memory cell is dramatically reduced. This enables providing a high density OTP memory cell at much lower cost. Also, the memory cell may be fabricated using standard semiconductor processes and materials, and thus, little to no capital investment is required beyond that present in the current state-of-the-art manufacturing. Further, the current flow in the memory cells is substantially perpendicular (vertical) to the substrate plane. This allows the cells to be inserted between adjacent conductors. In particular, the cells can be placed at an intersection of a cross-point array of conductors to form a cross-point OTP memory array. The cross-point memory arrays can be fabricated such that the planar area of each memory cell is $4\lambda^2$. Planes of these arrays can be stacked on top of one another, which increases the density dramatically.

BRIEF DESCRIPTION OF THE DRAWINGS

Features and advantages of the present invention will become apparent to those skilled in the art from the following description with reference to the drawings, in which:

FIGS. 2A-2 and 2D-2 illustrate modifications to the method of fabricating the first embodiment of the memory cell to fabricate the variations shown in FIG. 1C;

FIGS. 5B–5C illustrate simplified three-dimensional perspectives of stacked memory arrays using the unit memory cells according to an aspect of the present invention;

DETAILED DESCRIPTION

For simplicity and illustrative purposes, the principles of the present invention are described by referring mainly to exemplary embodiments thereof. However, one of ordinary skill in the art would readily recognize that the same principles are equally applicable to many types of a memory cells and methods of fabrication thereof.

In general, a memory cell, according to certain aspects of the present invention, is located at a cross-point of two conductors. The memory cell generally includes a vertically oriented fuse in series with a diode. The diode provides selectivity for reading and writing the memory cell and by significantly reducing or eliminating leakage current through memory cells connected in parallel with the selected cell.

Vertically oriented fuses have current flow that is vertical, i.e. perpendicular to the plane of the substrate. The vertically oriented fuses are manufactured such that a ratio of height to thickness of the fuse is at least 1, and is generally substantially greater than 1, perhaps as much as 30 to 1 or more. As will be seen later, vertically oriented fuses also allows for very high memory densities to be achieved.

Programming a memory cell that includes a vertically oriented fuse is accomplished by either applying a critical current $I_C$ if the second state is desired or leaving the cell alone if the first state is desired. The first and second states may be detected by applying a read voltage $V_R$ and detecting a presence or absence of an electrical current. Current presence indicates that the memory cell is in the first state and current absence indicates the second state. Also, because a diode is included as part of the unit memory cell, reading the state in a memory device made of such unit cells becomes relatively simple for reasons that will be discussed.

To program the cell, critical current $I_C$ must be generated as noted above. This is done by applying sufficient voltage across the fuse. The $I^2R$ process melts the fuse and the resistance increases until finally the fuse breaks and becomes an open circuit. Correspondingly, the current becomes zero.

Thus the memory cell with the vertically oriented fuse exhibits two states. The first state, or the initial state, exhibits a finite resistance. In this first state, some amount of current may flow since the resistance is finite. The second state exhibits an infinite resistance. As a result, no current may flow across the cell.

Figure 1A:
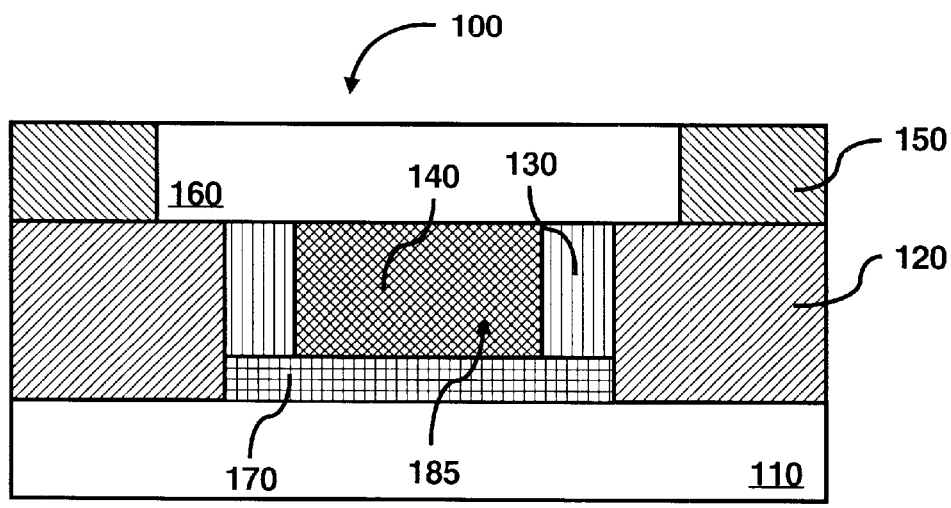
FIG. 1A illustrates a cross-sectional view of a first embodiment of a memory cell according to the principles of the present invention.

FIG. 1A illustrates a cross-sectional view of a first embodiment of a memory cell 100 according to an aspect of the present invention. As shown in FIG. 1A, the memory cell 100 may include a bottom conductor 110 and a first insulator 120 situated above the bottom conductor 110. The first insulator 120 is formed around a perimeter of a closed region 185. As will be demonstrated below, the closed region 185 substantially occupies a region defined by a cross-point 115 (shown in FIG. 1B) of the memory.

To form the bottom conductor 110, conductive materials such as aluminum, copper, gold, tungsten, and the like and any alloys thereof can be used. Polysilicon may also be used to form the bottom conductor 110. To form the first insulator 120, materials such as silicon oxides and nitrides, aluminum oxides and nitrides, silicon oxynitrides, tantalum oxides, and the like can be used.

The memory cell 100 may also include a vertically oriented fuse 130, an insulating plug 140, and a diode 170.

The vertically oriented fuse 130 and the insulating plug 140 may substantially occupy an edge and a center of the closed region 185, respectively, above the bottom conductor 110. The diode 170 may be placed such that the bottom conductor 110 is below and the fuse 130 and the insulating plug 140 are above the diode 170. However, other placements of the diode 170 are possible. It is only necessary that fuse 130 and the diode 170 are in series. Tops of the insulator 120, the fuse 130, and the insulating plug 140 may be coplanar.

To form the fuse 130, materials such as semiconductors (e.g. Si, Ge), conductors (e.g. Al, Cu, Ag, Au, Pt), low melting temperature materials (e.g. In, Zn, Sn, Pb), refractory metals (e.g. Ta, W), transition metals (Ni, Cr) and the like and any alloys thereof can be used. Also, the materials used to form the first insulator 120 can generally be used to form the insulating plug 140, although in certain embodiments it may be desirable for the insulating plug 140 to be etched away leaving a void. To form the diode 170, materials such as amorphous or crystalline Si, Ge, Ge—Si, and the like may be used. The diode 170 can be a P—N, P—I—N, or Schottky barrier structure.

As discussed above, the diode 170 may be used to select the memory cell by reducing leakage currents during the reading and writing processes. The leakage current is reduced because the current may enter the selected row/column combination through either the forward biased selected element or through a reverse biased unselected elements. Reverse biased currents are orders of magnitude lower than forward biased currents.

Note that the insulating plug 140 is not strictly necessary. The insulating plug 140 helps to control the cross-sectional area of the fuse 130 in a plane parallel to the substrate plane, for example the area of the fuse 130 contacting the diode 170. Presumably, it is possible that a memory cell can be fabricated with the appropriate amount of surface area such that the insulating plug 140 is not necessary.

The memory cell 100 may still further include a second insulator 150 and a top conductor 160, both situated above the first insulator 120, the vertically oriented fuse 130 and the insulating plug 140. While FIG. 1A shows that the top conductor 160 covers the entirety of the fuse 130 at the top of the closed region 185, this is not a requirement to practice the present invention. Similarly, FIG. 1A also shows that the bottom conductor 110 covers the entirety of the fuse 130 at the bottom of the closed region 185, but this is not a requirement as well.

While complete coverage is shown, it is required only that a conductive path between the top and the bottom conductors 160 and 110 exists. Thus, electrical connections should exist among the bottom conductor 110, the fuse 130, the diode 170, and the top conductor 160. It is not necessary that the bottom conductor 110, the fuse 130, the diode 170, and the top conductor 160 be in physical contact with each other.

Note that the second insulator 150 can be formed from similar materials used to form the first insulator 120 and the insulating plug 140, and the top conductor 160 can be formed from similar materials used to form the bottom conductor 110.

Figure 1B:
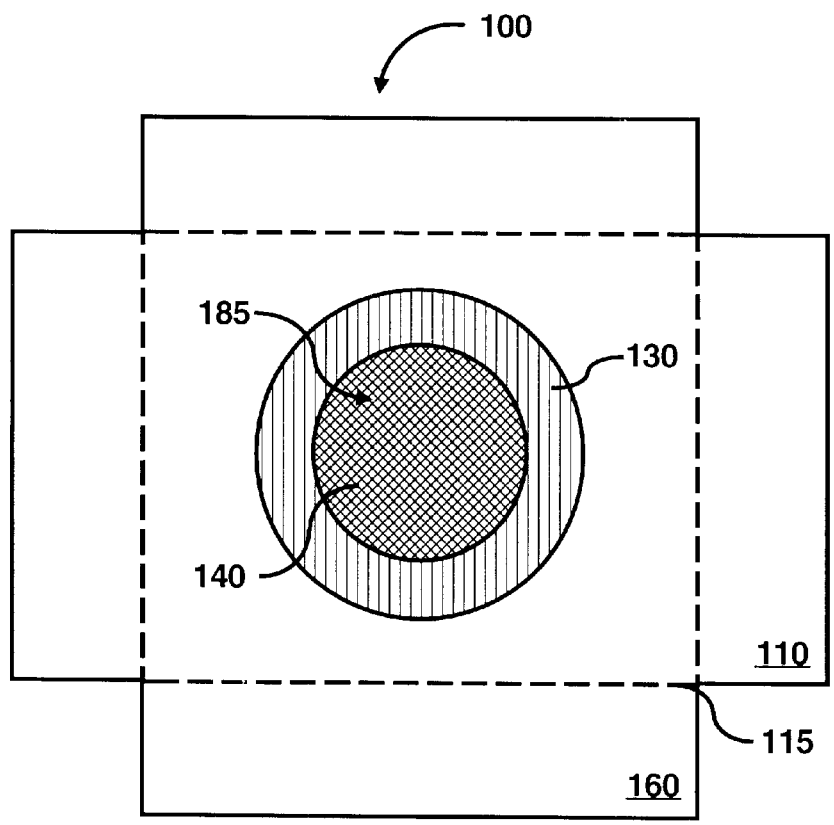
FIG. 1B illustrates a top view the first embodiment of FIG. 1A showing the cross-point nature of the memory cell.

FIG. 1B illustrates a top view of the first embodiment of FIG. 1A showing the fuse 130 and the insulating plug 140 substantially occupying the edge and center of the closed region 185, which is located within the cross-point 115 of the top and bottom conductors 160 and 110. The diode 170 (not shown in FIG. 1B) can have the same shape as the insulating plug 140 and fuse 130, or it can extend beyond the fuse 130 and assume a different shape. The top and bottom conductors 160 and 110 extend in their respective directions to form the cross-point 115 (shown as a dashed line region for illustrative purposes). Even though the closed region 185 is shown to be entirely located within the cross-point 115, this is not strictly required. As noted above, it is only necessary that electrical connectivity is maintained between the top and bottom conductors 160 and 110 through the structure within the closed region 185.

For simplicity the first and second insulators 120 and 150, respectively, are not included in FIG. 1B. Also, for illustrative purposes, the fuse 130 and the insulating plug 140 are shown at the cross-point. However, the top conductor 160 would generally cover the entirety of the fuse 130 and the insulating plug 140.

Also, in FIG. 1B, the closed region 185 is shown as being cylindrical with the fuse 130 substantially occupying an annulus of the closed region 185 and the insulating plug 140 substantially occupying a center of the closed region 185. However, the shape of the closed region 185 is not so limited and may include other shapes as well, such as a rectangle, a square, an ellipse, or any other enclosed shapes. Again, the insulating plug 140 may be partially or wholly etched away to leave a void.

Figure 1C:
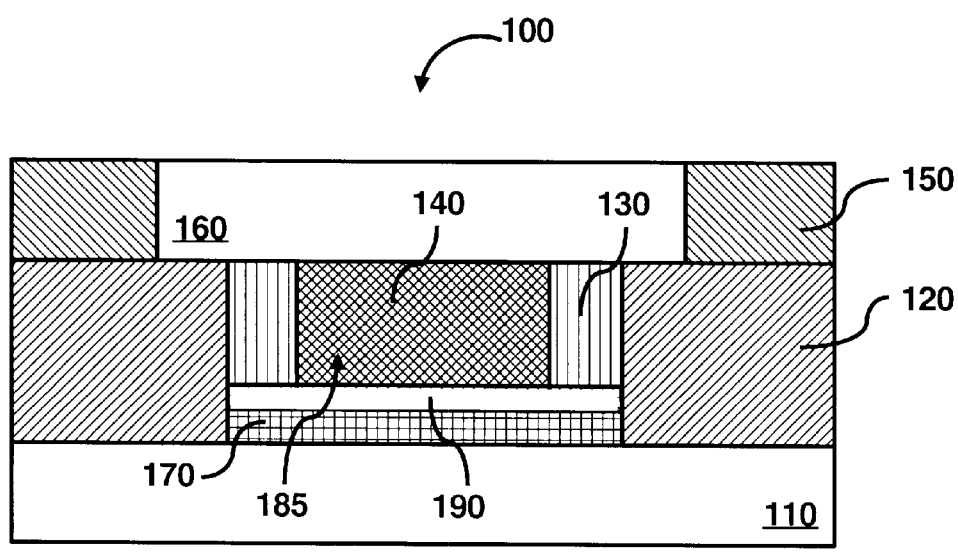
FIG. 1C illustrates a variation on the first embodiment of FIG. 1A.

FIG. 1C illustrates a variation on the first embodiment of FIG. 1A. In FIG. 1C, a thin conductor 190 is placed between the fuse 130 and the diode 170. The thin conductor 190 may be a Schottky or ohmic contact to the diode 170, or it may be a thermal insulator to better thermally isolate the fuse 130. While not shown, other placements of the thin conductors 190 are possible as long as electrical connectivity between the top and bottom conductors 160 and 110 is maintained.

As mentioned previously, some, or all, of the insulating plug 140 may be etched away leaving a void in the region of the insulating plug 140. This configuration provides extremely low thermal conductivity adjacent to the vertical fuse 130, and provides space for molten or evaporated fuse material to enter. These features lower the power necessary to break the vertically oriented fuse 130.

Figure 2A:
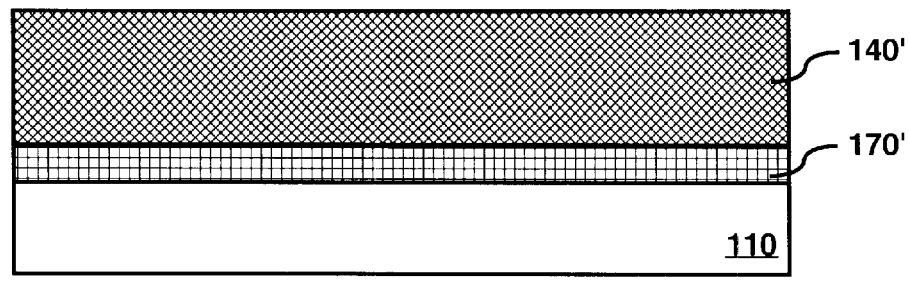
FIGS. 2A–2G illustrate cross-sectional views of an exemplary embodiment of a method of fabricating the first embodiment of the memory cell.

FIGS. 2A–2G illustrate cross-sectional views of an exemplary embodiment of a method of fabricating the first embodiment of the memory cell of FIG. 1A. As shown in FIG. 2A, a conductive material may be deposited and patterned to form the bottom conductor 110. Then a diode material 170' may be deposited above the bottom conductor 110. As part of the patterning process, the bottom conductor 110 may be planarized, by using well-known methods such as chemical-mechanical polishing ("CMP") prior to depositing the diode material 170'. Similarly, the diode material 170' may be planarized as well.

Figure 2B:
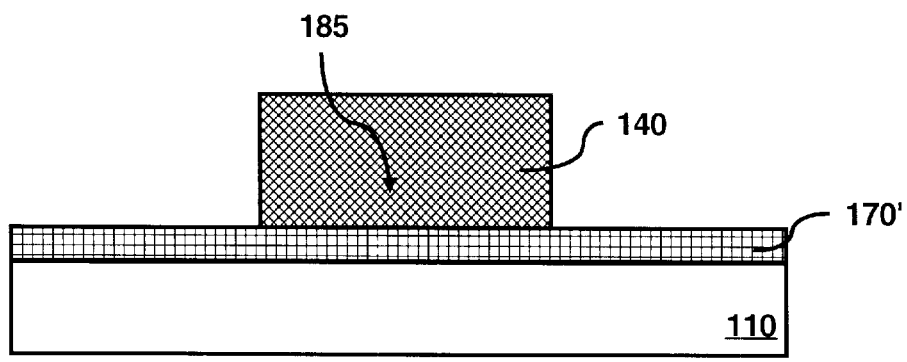

Subsequently, a dielectric film 140' may be deposited over the diode material 170'. Then, as shown in FIG. 2B, the dielectric film 140' may be etched to form the insulating plug 140. Standard lithography and etch methods may be used to form the insulating plug 140.

Figure 2C:
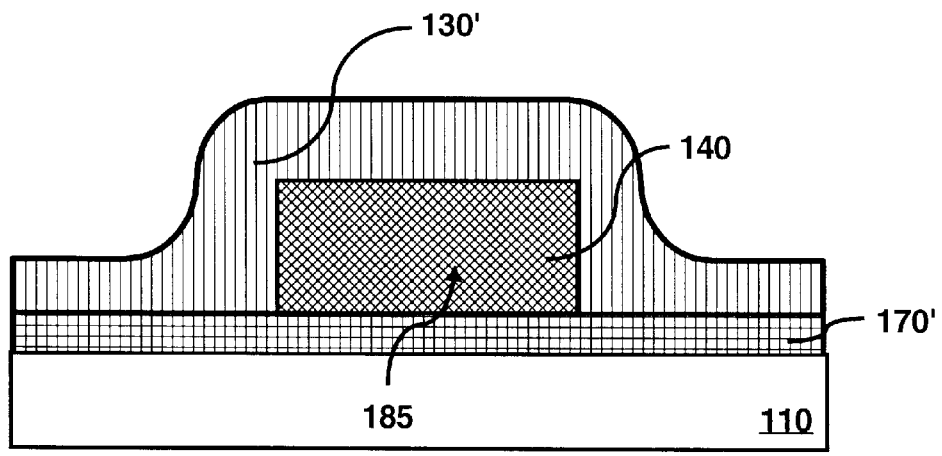
Figure 2D:
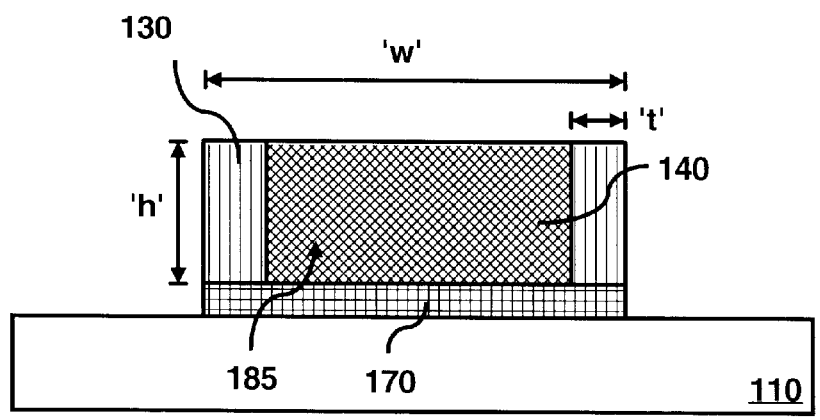

Then, as shown in FIG. 2C, a fuse material 130' may be deposited over the diode material 170' and even over the insulating plug 140. A deposition method such as atomic layer deposition (ALD) may be used to ensure a conformal coating and precise control of the thickness of the fuse material 130'. Afterwards, the fuse material 130' may be etched to leave the fuse material 130' primarily on the wall of the insulating plug 140 and thereby forming the vertically oriented fuse 130, as shown in FIG. 2D. The fuse 130 may be formed by anistropically etching the fuse material 130' using ion etching, reactive ion etching, or other etching methods.

Note that the vertically oriented fuse 130 is generally formed within the closed region 185. Also note that the etching process may etch the diode material 170' leaving a diode 170 so that the bottom conductor 110 is exposed in areas perimeter to the closed region 185. Note 710 further that the ratio of the height 'h' of the vertically oriented fuse 130 to the width 'w' of the closed region 185 can be large such as 5 to 1 or more. When anisotropic etching is used, the process inherently leaves behind the fuse 130 primarily on the vertical sidewalls of the insulating plug 140. Thus lateral area consumption is kept to a minimum, which allows for precise control of the lateral thickness 't' of the fuse 130. Note that the height 'h' to lateral thickness 't' ratio of the fuse 130 can be extremely large, such as 30 to 1 or more. Also, since the fuse 130 is only on the perimeter of the closed region 185, whereas the diode 170 covers at least the entire base of the closed region 185, the ratio of a diode area to fuse area can also be substantial.

Figure 2E:
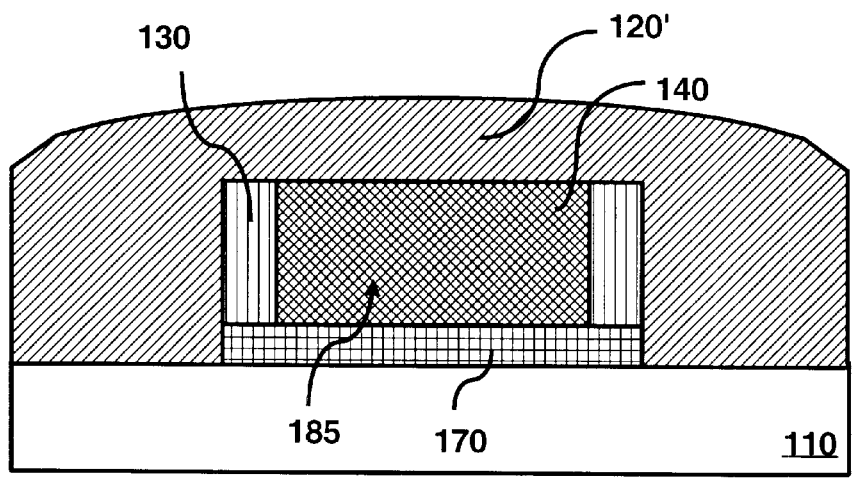
Figure 2F:
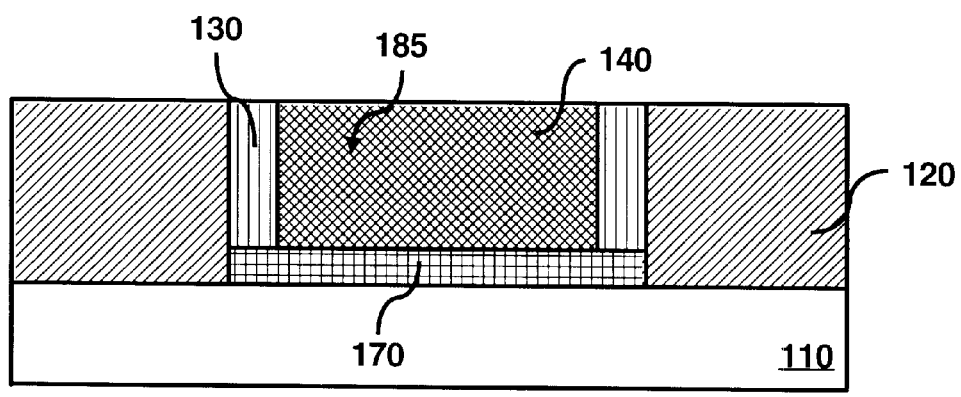

Then as shown in FIG. 2E, an insulating material 120' may be deposited over the bottom conductor covering the area outside the perimeter of the closed region 185. Then the insulating material 120' is patterned to form the first insulator 120 as shown in FIG. 2F. The first insulator 120 may be patterned by planarizing the insulating material 120' to expose the fuse 130 and the insulating plug 140, again using CMP and/or other planarizing method(s). Indeed, the tops of the first insulator 120, fuse 130, and insulating plug 140 may define a plane. At this point the vertically oriented fuse 130 is bounded on all vertical sides by insulator. This configuration reduces heat transfer from the fuse to its surroundings.

Figure 2G:
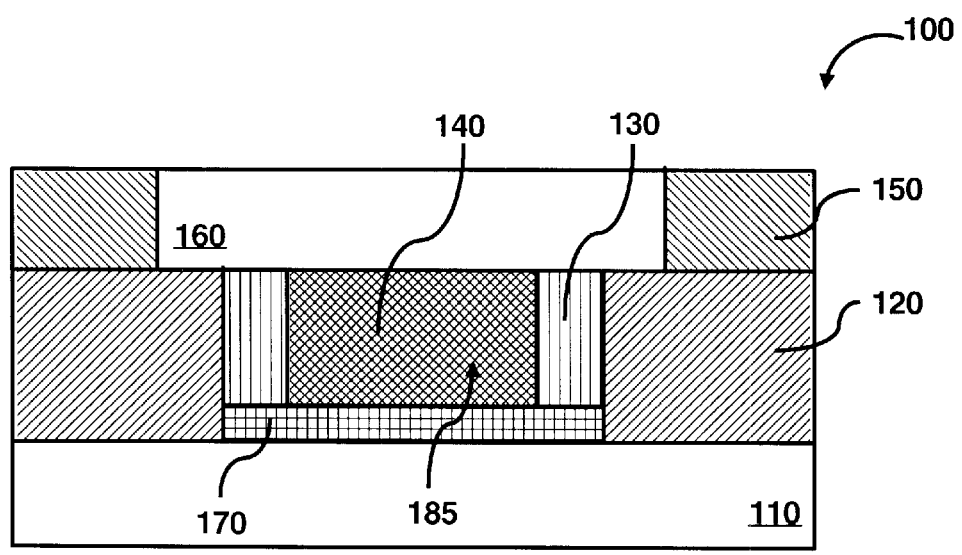

Then to complete the process a conductor material may be deposited over the fuse 130, insulating plug 140, and first insulator 120 and patterned to form the top conductor 160. A second insulating material may be deposited over top of the patterned conductor 160 and first insulator 120, and then planarized by CMP or other methods to form the second insulator 150 as shown in FIG. 2G (same as FIG. 1A).

If a void is desired in the region of the insulating plug 140, then the insulating material can be removed by either wet or dry etching after definition of the top conductor 160. Access to the insulating plug 140 may be possible when the top conductor 160 does not completely cover the insulating plug 140. In other words, to generate a void region, the top conductor 160 and insulating plug 140 may be misaligned with respect to one another such that a portion of the insulating plug 140 is exposed for etching. After creating the void, the second insulator 150 can be deposited and patterned to complete the memory cell.

Figures 2, 2A:
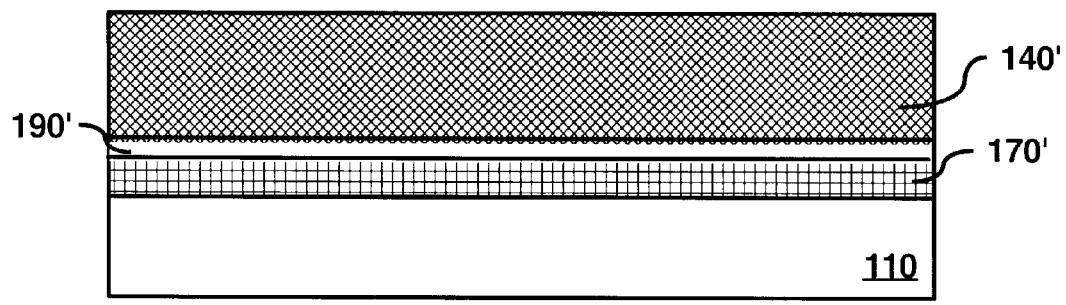
Figures 2, 2D:
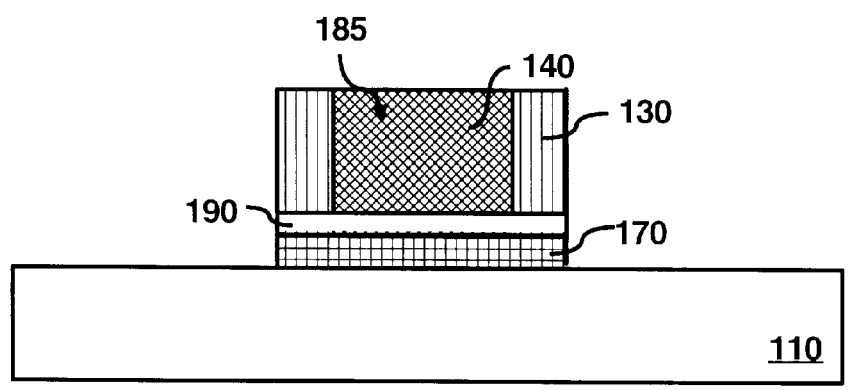

The steps indicated by FIGS. 2A–2G may be modified to fabricate the variations as shown in FIG. 1C. For example, to fabricate the thin conductor between the diode 170 and the fuse 130 as shown in FIG. 1C, the fabrication steps illustrated in FIG. 2A may be replaced by FIG. 2A-2. As shown in FIG. 2A-2, a thin conductor material may be deposited and patterned above the diode material 170' to form the thin conductor 190. The dielectric material 140' may be deposited on top of the thin conductor 190 afterwards. The fabrication then may proceed as described above and in FIGS. 2B–2G. Note that when the etching takes place to form the vertically oriented fuse 130, the thin conductor 190 and the diode 170 are etched to expose the bottom conductor 110 as shown in FIG. 2D-2.

While not shown, other variations are possible in addition to the variations shown in FIG. 1C. For example, multiple thin conductors may be formed to augment the performance of the diode 170 or the fuse 130.

Figure 3A:
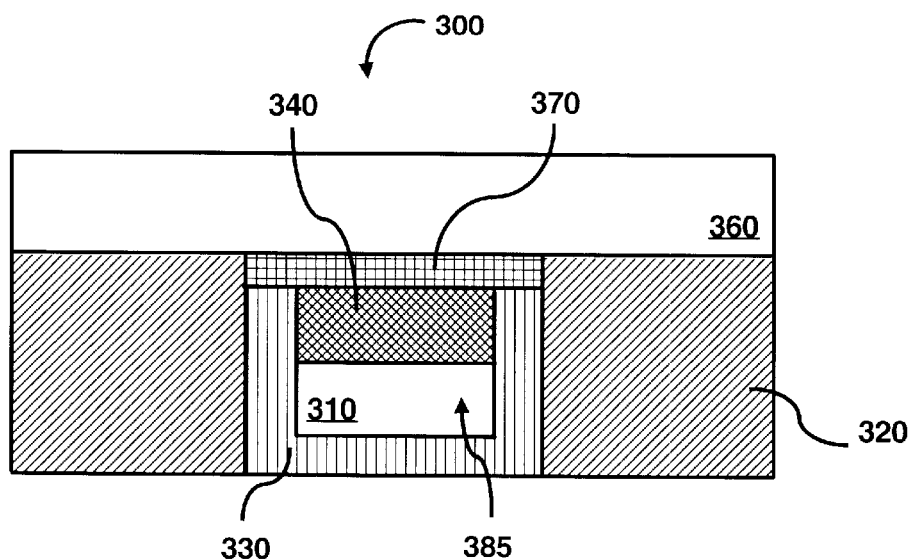
FIG. 3A illustrates a cross sectional view of a second embodiment of a memory cell according to the principles of the present invention.

FIG. 3A illustrates a cross-sectional view of a second embodiment of a memory cell 300 according to an aspect of the present invention. As shown, the memory cell 300 may include a vertically oriented fuse 330 and a first insulator 320 formed on an exterior region of the vertically oriented fuse 330. As will be seen later, the interior of the vertically oriented fuse 330 may or may not be completely filled.

The cell 300 may also include a bottom conductor 310. Note that vertical portions of the vertically oriented fuse 330 and the bottom conductor 310 make up a 'U' region 385. This 'U' region concept is better illustrated in FIG. 3D where the two vertical fuses 330 and the bottom conductor 310 make up the 'U' region 385, i.e. there is no horizontal portion to the fuses. The horizontal portion of the fuse 330 of FIG. 3A is not necessary to practice the invention.

The cell 300 may further include an insulating plug 340 occupying some or substantially all of the interior of the 'U' region 385, i.e. interior region of the vertically oriented fuse 330. The cell 300 may still further include a diode 370 substantially occupying a top of the 'U' region 385 and a top conductor 360 above the diode 370. Note that the vertically oriented fuse 330 and the insulating plug 340 may define a plane.

Materials used to form the various parts of the memory cell have been discussed above, and thus will not be repeated. Again, for reasons discussed before, the insulating plug 340 is not strictly necessary. Further, top surfaces of the first insulator 320 and the diode 370 may be coplanar.

Figure 3B:
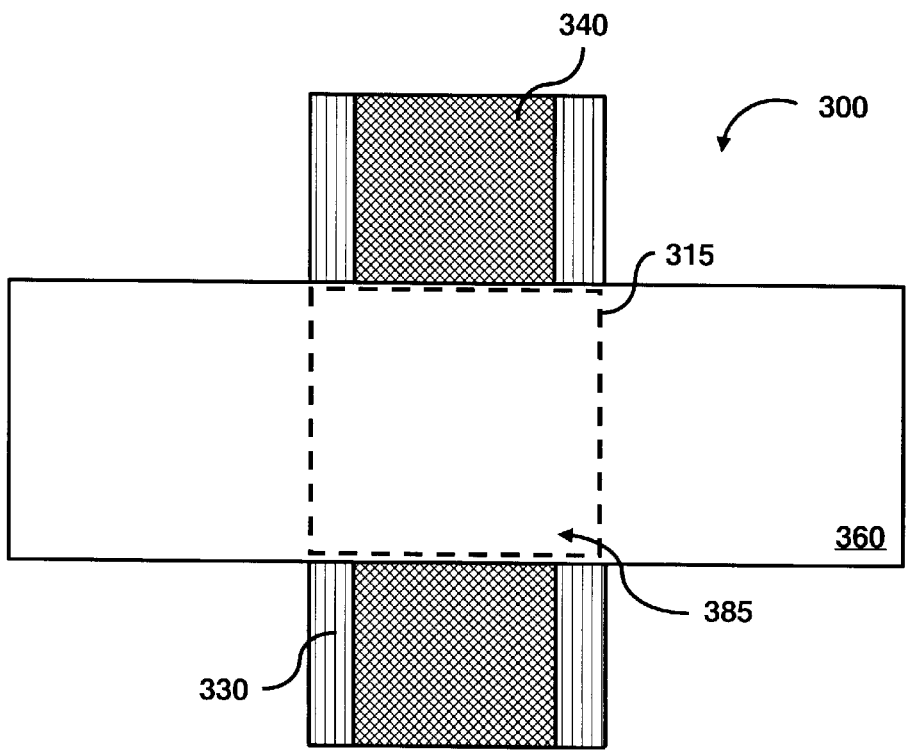
FIG. 3B illustrates a top view the second embodiment of FIG. 3A showing the cross-point nature of the memory cell.

FIG. 3B illustrates a top view of the second embodiment of FIG. 3A. As shown, the top conductor 360 may extend in a first direction. The fuse 330, and thus the 'U' region 385, including the insulating plug 340 and the bottom conductor 310 (both not shown in FIG. 3B) may extend in a second direction and thereby defining a cross-point at the intersection.

However, instead of extending in the first direction like the top conductor 360, the diode 370 may be substantially limited to an area defined by a cross-point 315 above the vertically oriented fuse 330 and below the top conductor 360.

Figure 3C:
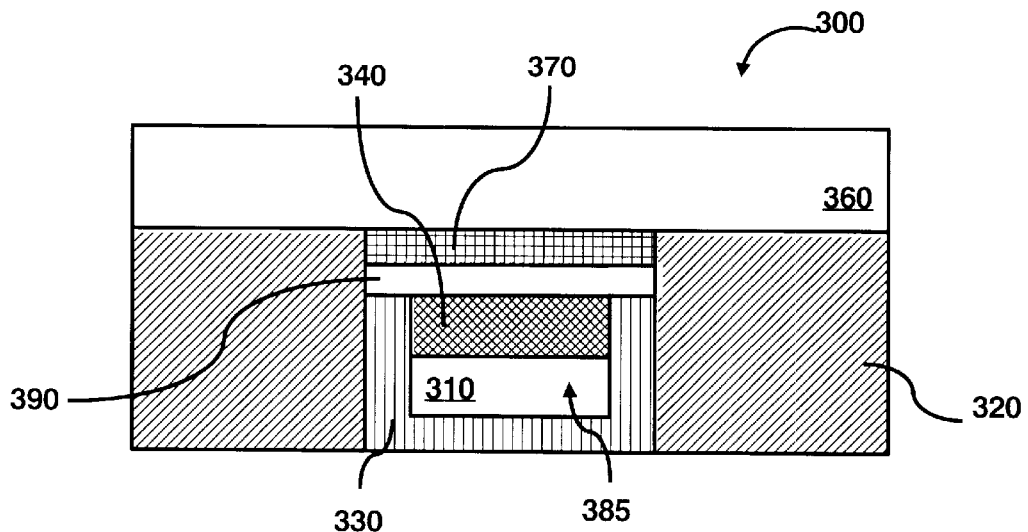
FIGS. 3C–3E illustrate variations on the first embodiment of FIG. 3A.

FIG. 3C illustrates a variation on the second embodiment of FIG. 3A. In FIG. 3C, a thin conductor 390 may be placed between the fuse 330 and the diode 370 to enhance performance of the memory cell 300 as discussed previously with respect to the variations on the first embodiment. Note the placement of the thin conductor 390 may be varied and is not limited to the placement as shown in FIG. 3C.

Also, like the diode 370, the thin conductor 390 may occupy an area substantially limited to the cross-point 315, and would not extend in the second direction unlike the fuse 330, the bottom conductor 310, and the insulating plug 340. Note that the fuse 330 and the insulating plug 340 may be coplanar.

Figure 3D:
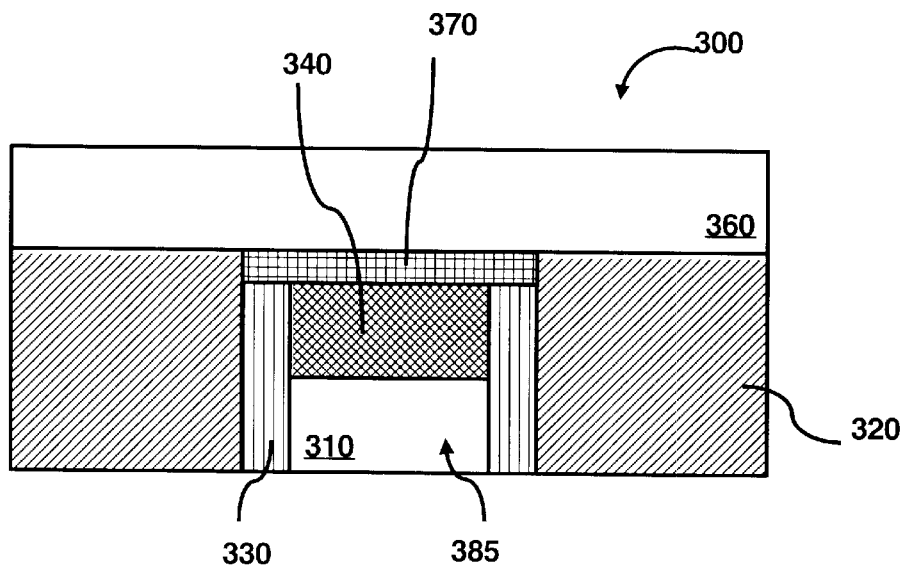

FIG. 3D, in addition to clarifying the 'U' region 385, also illustrates a variation of the on the second embodiment of FIG. 3A. As noted above, the horizontal portion of the vertically oriented fuse 330 is not necessary to practice the invention. FIG. 3D demonstrates this concept.

Figure 3E:
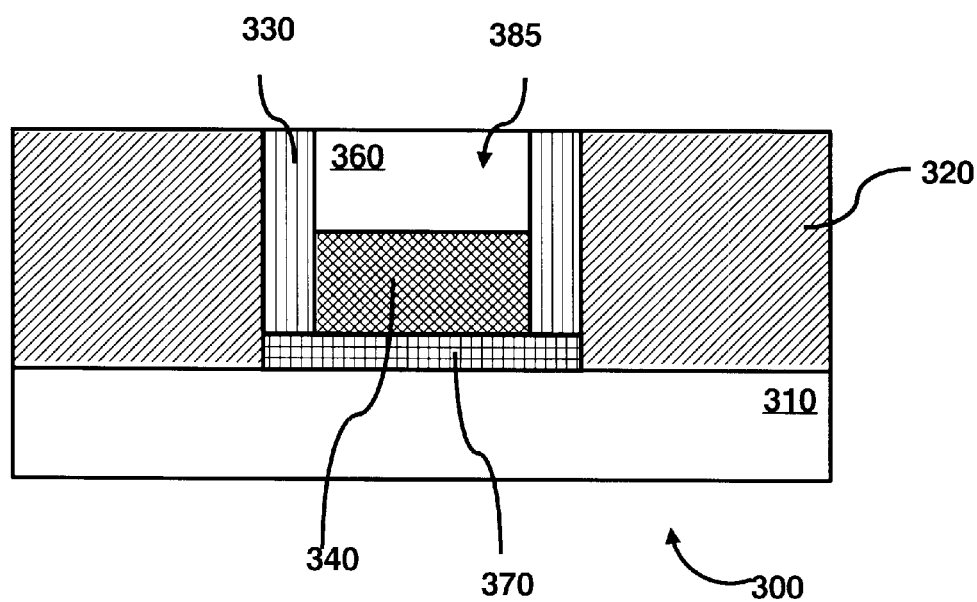

While the foregoing descriptions of the memory cell associated FIGS. 3A–3D may indicate that the vertically oriented fuse 330, insulating plug 340, and the 'U' region 385 extend in a direction similar to the bottom conductor 310, this orientation is not required to practice the present invention. Indeed, the vertically oriented fuse 330 may extend in direction similar to the top conductor 360. In this case the vertical portions of the vertically oriented fuse 330 and the top conductor 360 may now make up an inverted 'U' region 385. An insulating plug 340 may again occupy some or substantially all of the inverted 'U' region 385. The memory cell 300 may still further include a diode 370 substantially occupying the bottom of the inverted 'U' region 385 and a bottom conductor 310 below the diode 370. An example of this alternate configuration is illustrated in FIG. 3E.

Figure 4A:
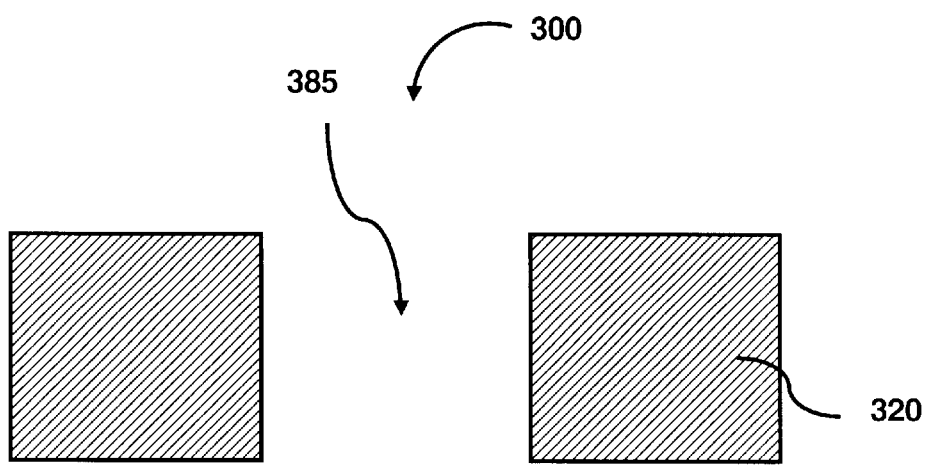
FIGS. 4A–4J illustrate cross-sectional views of an exemplary embodiment of a method of fabricating the second embodiment of the memory cell.

FIGS. 4A–4J illustrate cross-sectional views of an exemplary embodiment of a method of fabricating the second embodiment of the memory cell of FIG. 3A. As shown in FIG. 4A, an insulator material maybe deposited and patterned to form the first insulator 320. The first insulator 320 may be patterned to define a trench where the 'U' region 385 will be formed. Again, a height to width ratio of the 'U' region 385 can be large (5 to 1 or more).

Figure 4B:
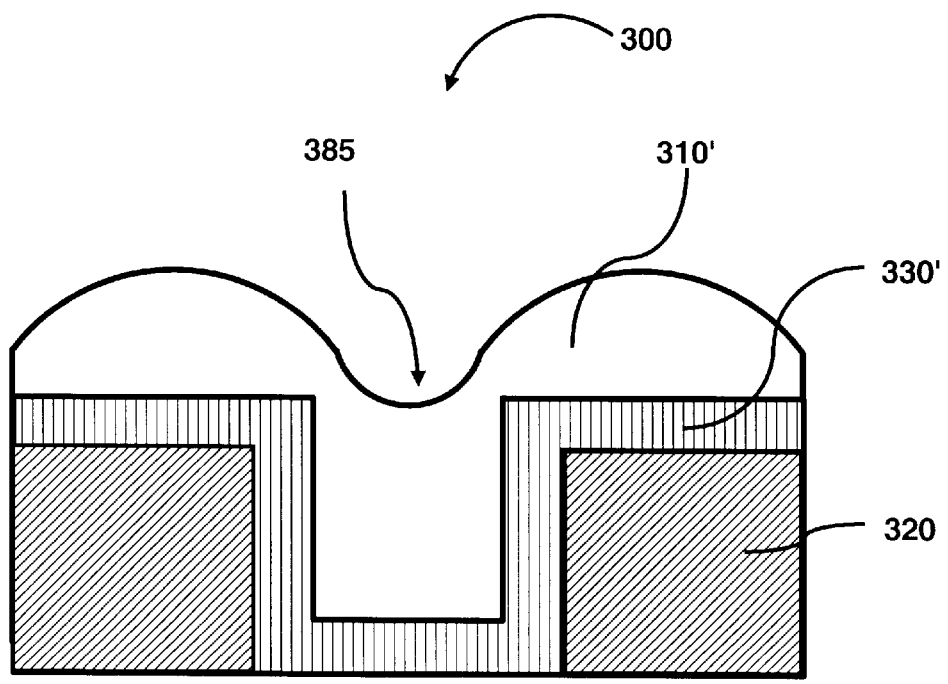

Then, as shown in FIG. 4B, a fuse material 330' may be deposited into the trench and even over the first insulator 320. The deposition naturally creates the 'U' shape of the fuse 330. Conformal coating of the first insulator 320, including vertical walls, may be achieved using deposition methods as ALD and the like. Then a conductor material 310' is deposited over the fuse material 330' including into the 'U' region 385.

Figure 4C:
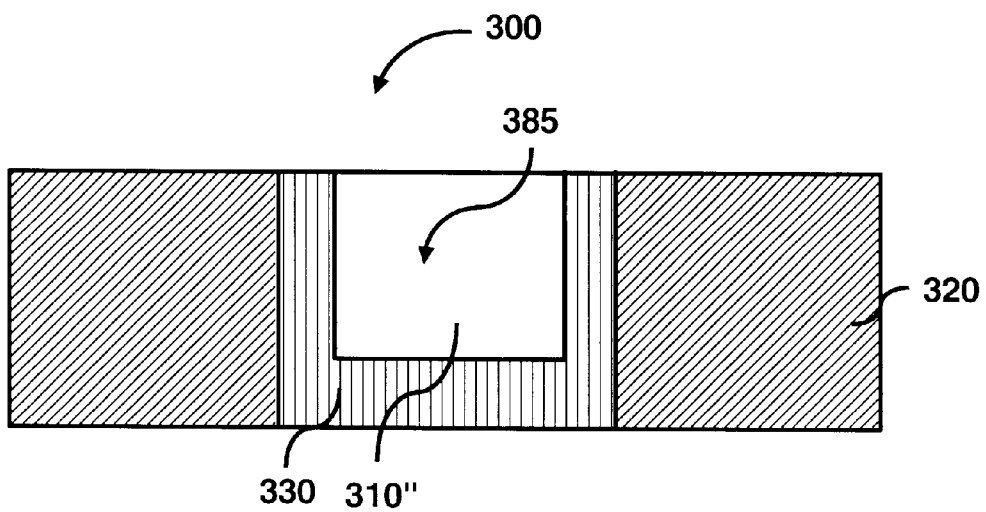

Then as shown in FIG. 4C, the fuse material 330' and conductor material 310' are planarized using standard methods such as the CMP. At this point, the first insulator 320, the bottom conductor 310, and the fuse 330 may be coplanar.

Figure 4D:
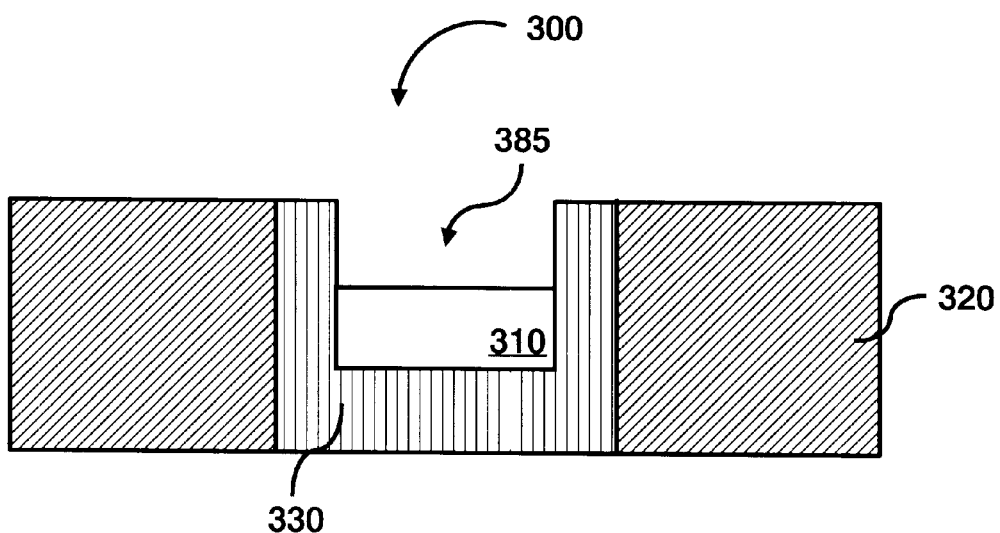

Then, as shown in FIG. 4D, the bottom conductor 310 may be preferentially etched using etching techniques such as wet etching, reactive ion etching, ion milling, and the like, to a prescribed depth so that the bottom conductor 310 forms a lateral portion of the 'U' region 385.

Figure 4E:
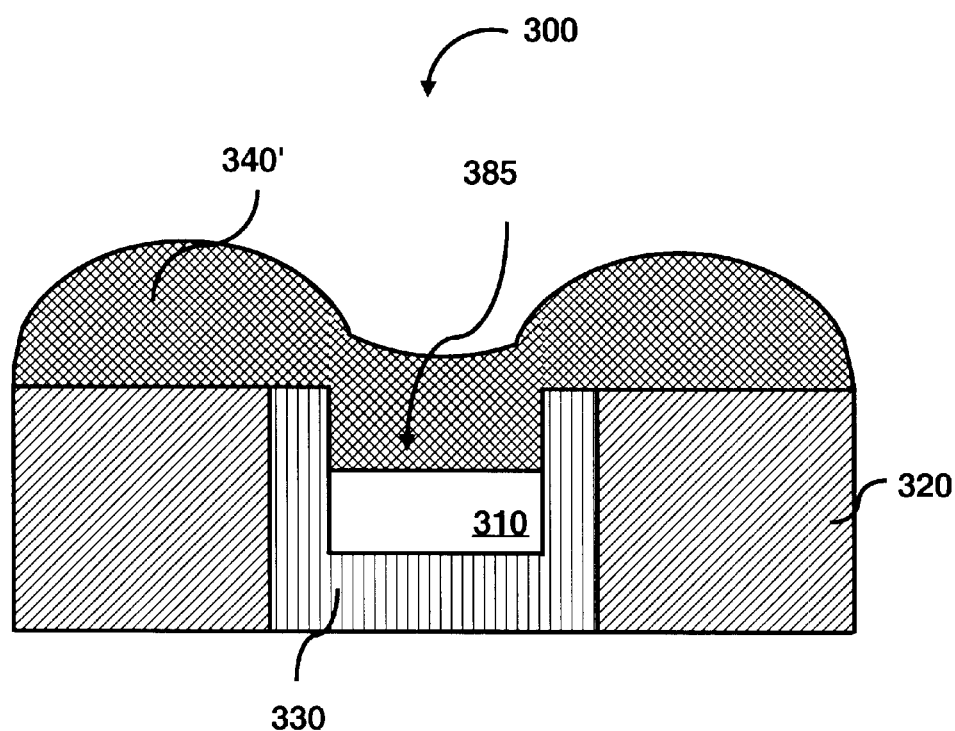
Figure 4F:
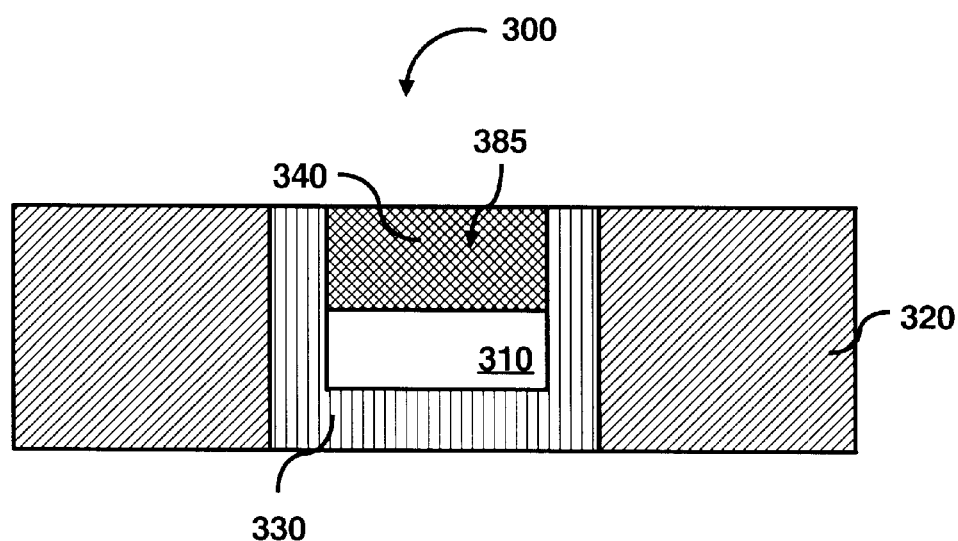

Then, as shown in FIG. 4E, an insulating plug material 340' may be deposited to fill the interior of the 'U' region 385, i.e. the interior of the vertically oriented fuse 330, and the resulting surface may be planarized. At this point, the insulating plug 340, the first insulator 320, and the fuse 330 may be coplanar as shown in FIG. 4F.

Figure 4G:
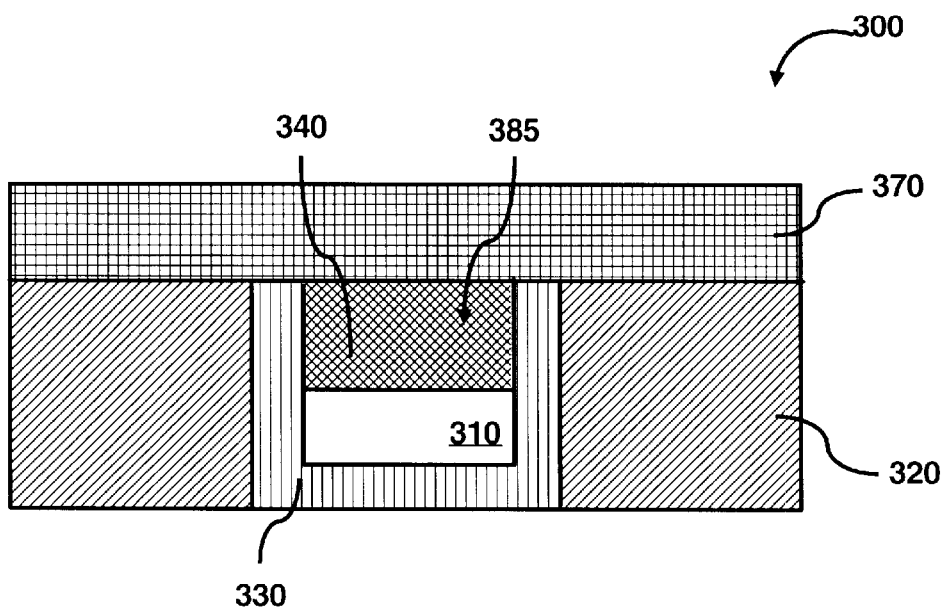
Figure 4H:
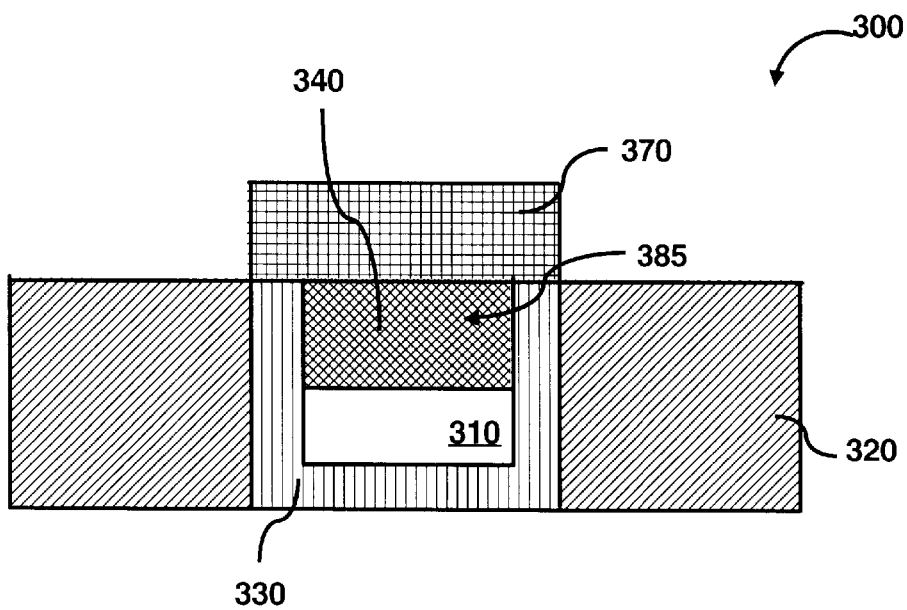

Then a diode material 370' may be deposited as shown in FIG. 4G. The diode material 370' is then lithographically defined over the 'U' region 385 to form the diode 370 as shown in FIG. 4H. Processes such as reactive ion etching, ion milling, wet chemical etching, and the like can be used to pattern the layers. While the width of the diode 370 is shown to equal the width of the 'U' region 385 in FIG. 4H, the width of the diode 370 is not restricted to this dimension.

Figure 4I:
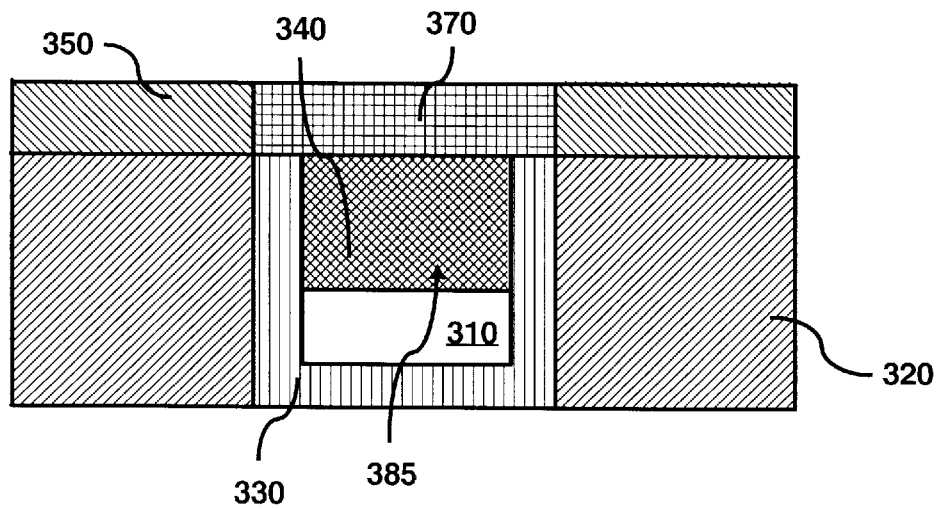
Figure 4J:
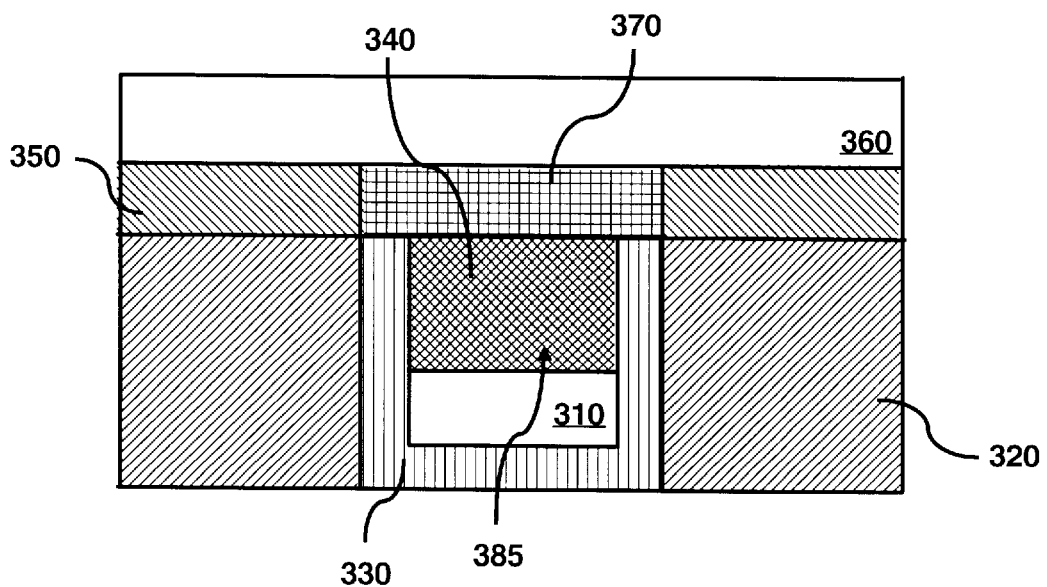

The diode 370 can then be coated by an insulating film, which can then be planarized to create a second insulator 350, as shown in FIG. 4I. The second insulator 350 provides electrical isolation around the perimeter of the diode. The types of materials to form an insulator have been discussed above and need not be repeated here. Then, to complete the process, another conductor material may be deposited and patterned to form the top conductor 360 as shown in FIG. J. Also, planarizing the top conductor 360 may be part of the fabrication process.

It should be noted that while the first and second insulators 320 and 350 are listed separately, conceptually they may be thought of as a single insulator. The insulators 320 and 350 are patterned separately in this embodiment only because of the particular method of fabrication of the diode 370. However, it may be possible to form a single insulator that is substantially equivalent to the first and second insulators 320 and 350 without separate processing steps. For example, FIG. 3A may be thought of as being similar as FIG. 4J in that the insulator 320 of FIG. 3A is substantially equivalent to the first and second insulators 320 and 350 of FIG. 4J.

While not shown, the steps indicated by FIGS. 4A–4J may be modified to fabricate the variations of FIGS. 3C and 3D. For example, to fabricate the thin conductor 390 as shown in FIG. 3C, the thin conductor material may be deposited prior to the diode material 370' and then patterned along with the diode material 370'. These processes are represented in FIG. 4G and FIG. 4H. One of ordinary skill would be able to insert the thin film conductor 390 into the memory cell.

To fabricate the variation as shown in FIG. 3D, a conductive material and an insulating material may be deposited and fabricated to form the bottom conductor 310 and the insulating plug 340. Then a fuse material may be deposited and etched to form just the vertical portions of the vertically oriented fuse 330. Afterwards, insulating material maybe deposited surrounding the fuse 330. One of ordinary skill may then fabricate the remainder of the cell 300 as shown in FIG. 3D.

In certain embodiments it may be advantageous to remove the insulating plug 340 and leave a void, or partial void, beneath diode 370 or thin conductor 390. A void can be created by using the diode 370 as a mask for etching the insulating plug 340 after patterning the diode (refer to FIG. 4H). Preferential removal of the insulating plug 340 can be achieved by reactive ion etching, wet chemical etching, or other etching means. Following removal of insulating plug 340, the remainder of the process remains the same as described with reference to FIG. 4I and FIG. 4J.

Figure 5A:
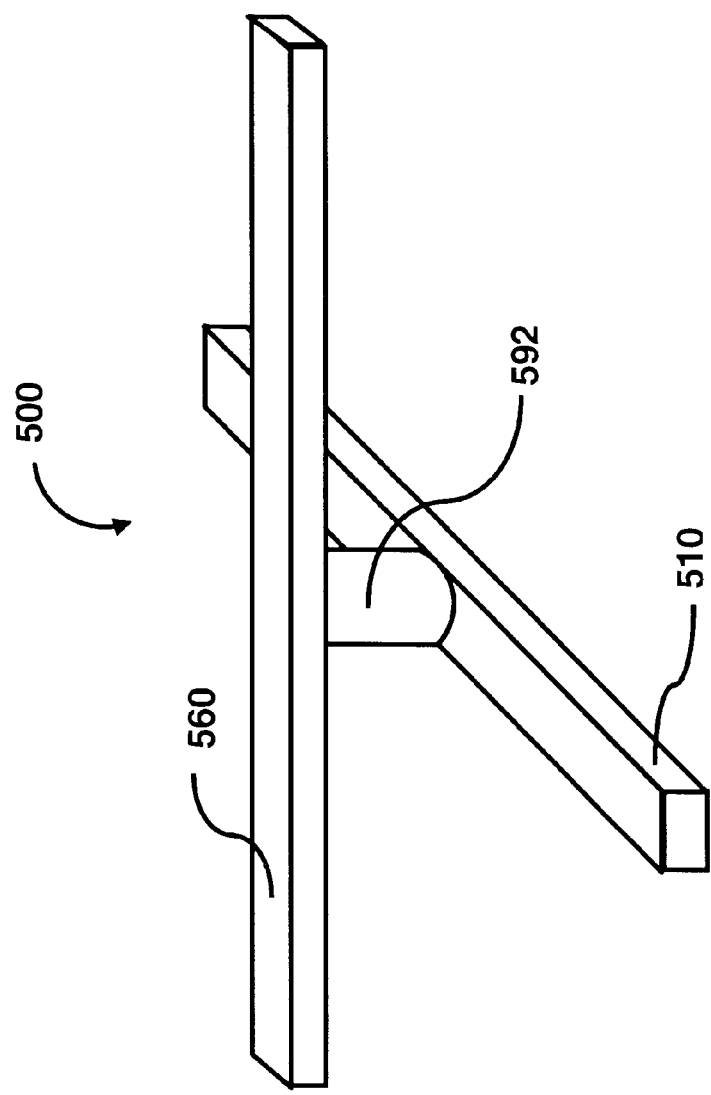
FIG. 5A illustrates a simplified three-dimensional perspective of a unit memory cell of a memory array according to an aspect of the present invention.

Using the unit memory cells 100, 300, and variations thereof, a one-time programmable memory device can be fabricated. FIG. 5A illustrates a simplified three-dimensional perspective of a unit memory cell 500 of a memory array according to an aspect of the present invention. As shown, the memory cell 500 includes a row and column conductors 560 and 510. The row and column conductors 560 and 510 may correspond to the top and bottom conductors of FIGS. 1A and 3A. In between the conductors, a state element 592 is formed. The state element 592 may correspond to the vertically oriented fuse and diode combination and optionally the insulating plug as shown in FIGS. 1A and 3A as well as the variations, for example as shown in FIGS. 1C and 3C. For simplicity, insulators that may normally surround the state element 592 are not included in FIG. 5A.

Figure 5C:
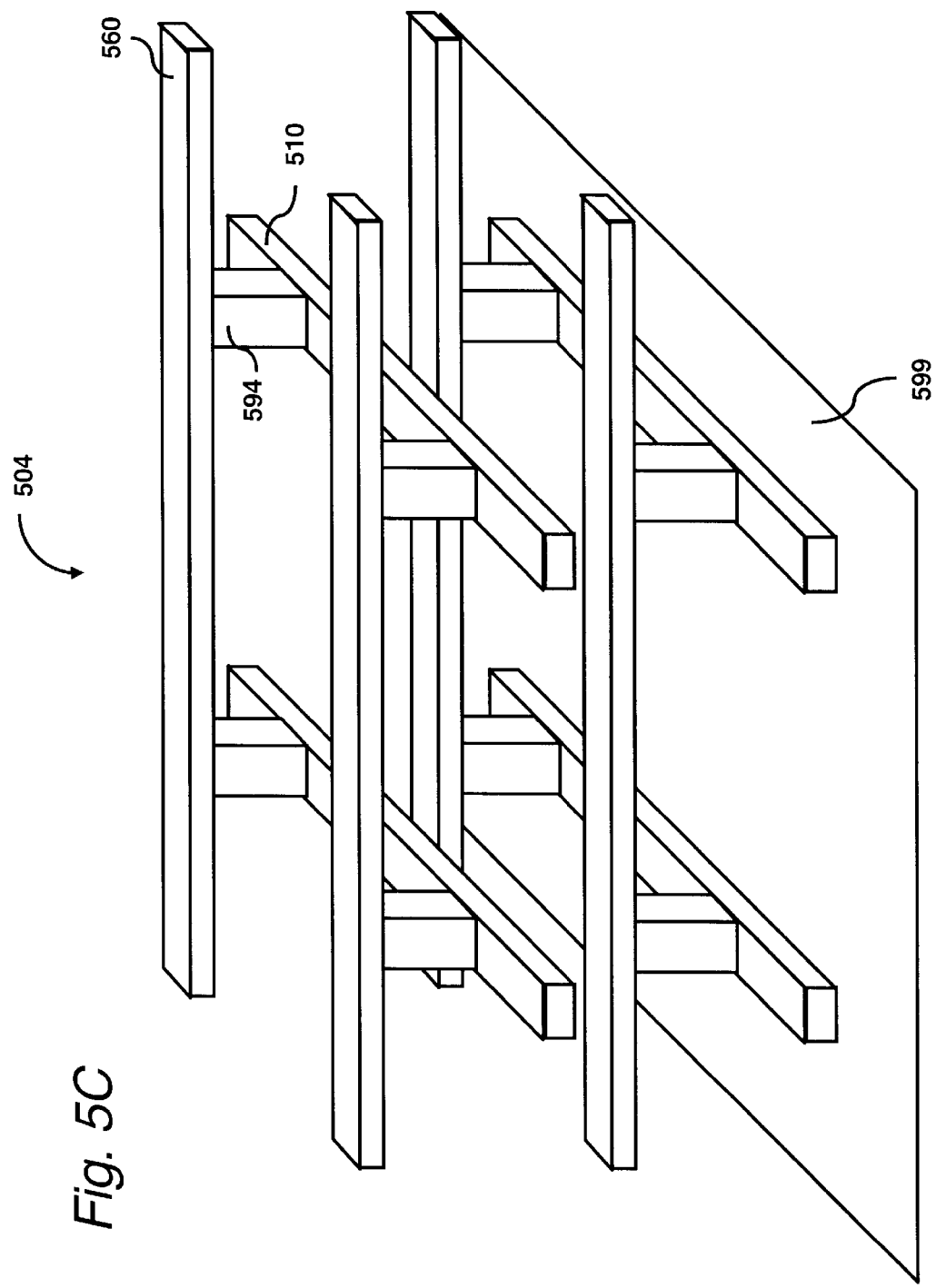

FIGS. 5B–5C illustrate simplified three-dimensional perspectives of stacked memory arrays according to an aspect of the present invention. In FIG. 5B, a memory 502 includes a plurality of row conductors 560, a plurality of column conductors 510, and a plurality of state elements 592. The entire memory 502 may be placed above a substrate 599. Where the row and column conductors 560 and 510 define a cross-point, a state element 592 maybe placed.

A memory array may be defined as a plurality of state elements 592 that are all on a same level. The row and column conductors 560 and 510 may also be a part of the memory array. In FIG. 5B, there are 3 memory arrays stacked on top of one another. However, many levels of memory arrays may be stacked. Again, insulators that may normially surround the state elements 592 are not included in FIG. 5B for simplicity.

The memory arrays shown in FIG. 5B are stacked such that 3 memory arrays require 4 conductor levels. This can be generalized to a memory with N memory arrays requiring N+1 conductor levels.

It is also possible to configure the memory arrays such that N memory arrays require 2N conductor levels; for example, in FIG. 5C where two memory arrays and four conductor levels are shown. In this configuration, each memory plane is electrically independent of other memory planes.

Also, while FIG. 5B shows cylindrical state elements 592, FIG. 5C shows a memory 504 with rectangular state elements 594. This is to illustrate that the shape of the state element is not limited to any particular shape.

Figure 5D:
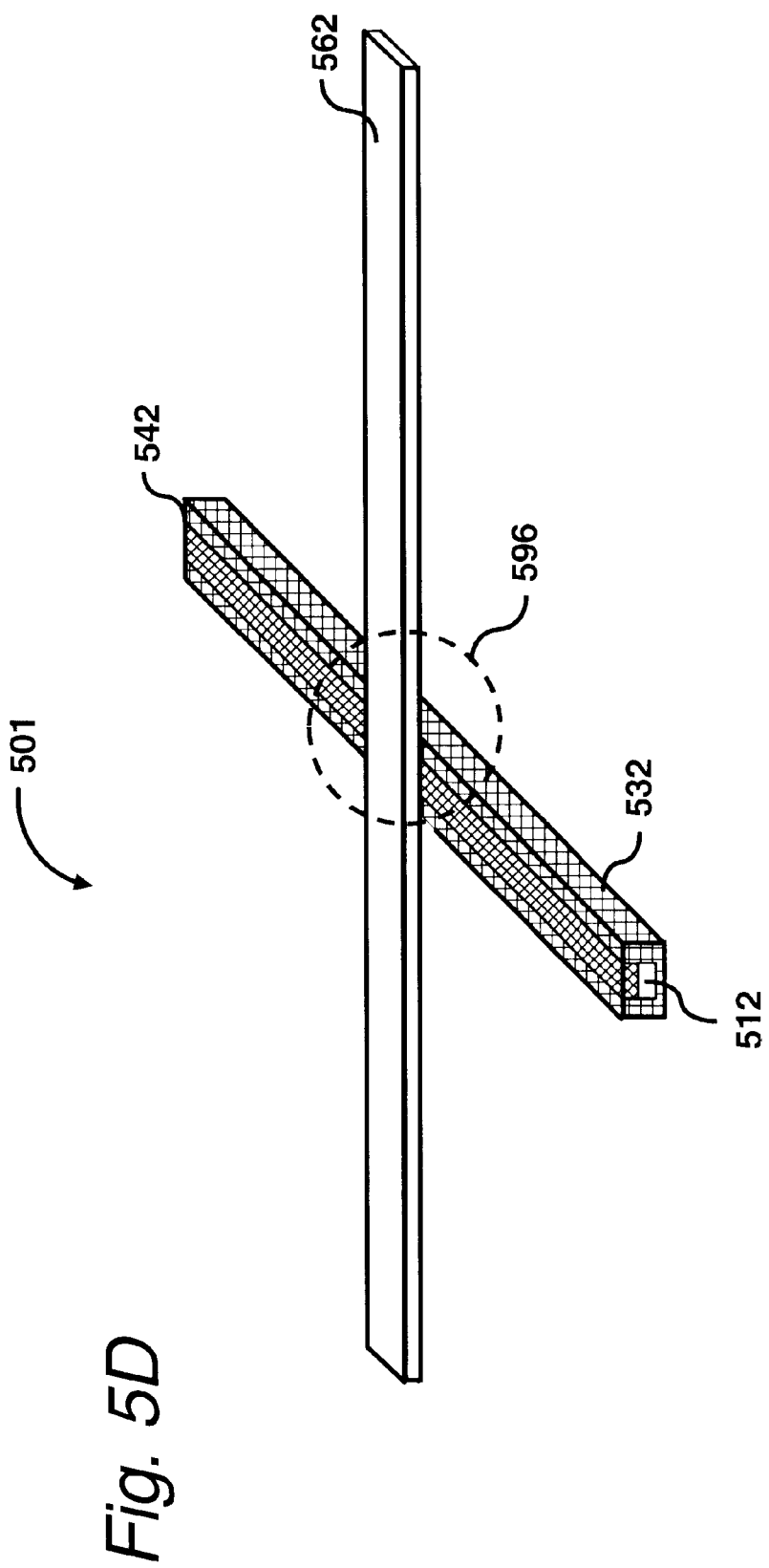
FIG. 5D illustrates a simplified three-dimensional perspective of another unit memory cell of a memory array according to another aspect of the present invention.

FIG. 5D illustrates a three-dimensional perspective of the unit memory cell 300 of FIG. 3A, relabeled as 501 in this figure. As shown, the memory cell 501 includes row and column conductors 562 and 512, a fuse 532, and an insulating plug 542. The diode of the memory cell 300 is obscured by the row conductor 562, and therefore is not shown. In this instance, the combination of the fuse 532 and the diode may comprise a state element 596 at the crosspoint of the row and column conductors. While not shown, the variation as shown in FIG. 3C may easily be substituted. Again for simplicity, insulators that may normally surround the state element 596 are not included in FIG. 5D.

Figure 5E:
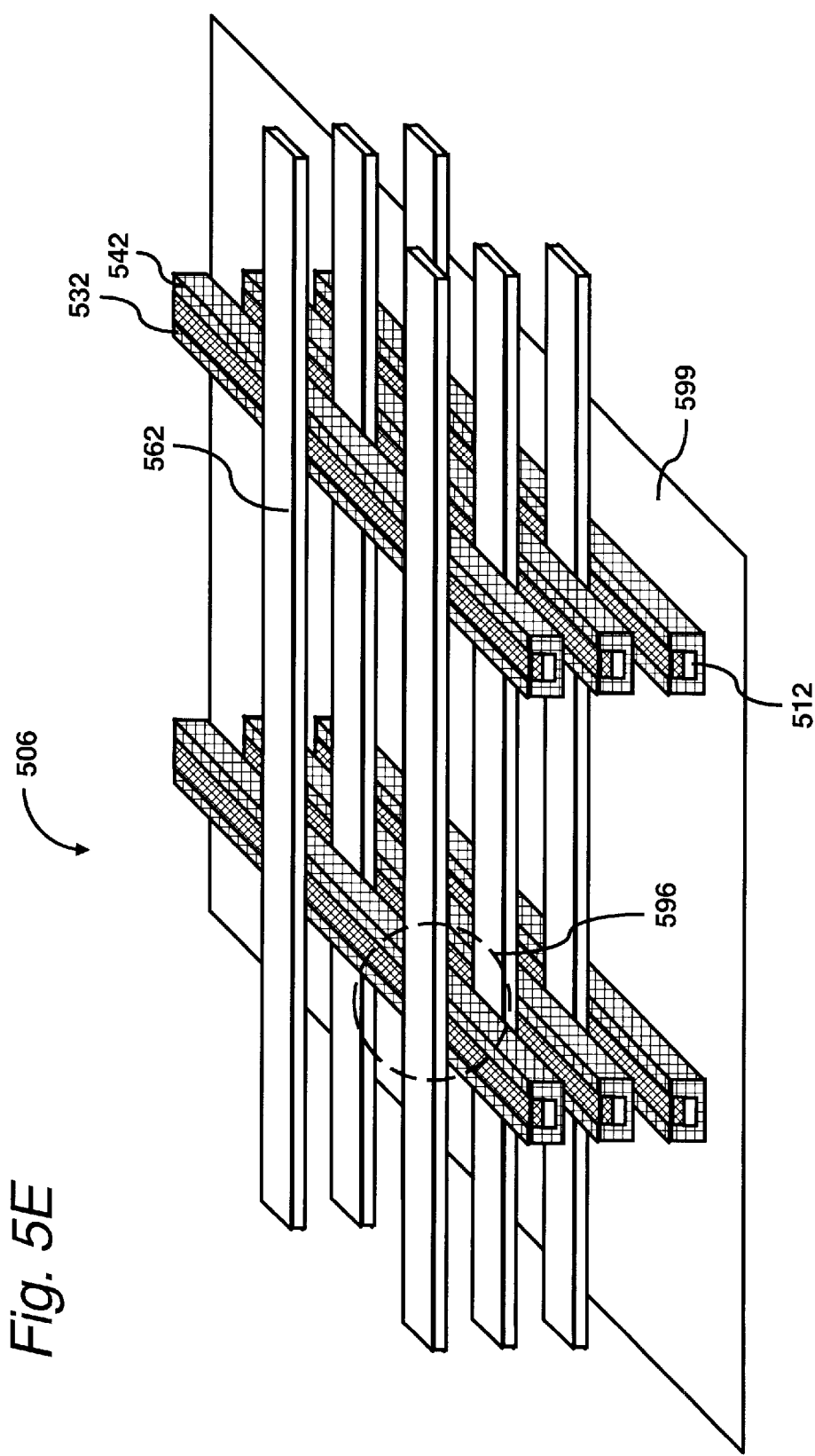
FIG. 5E illustrates simplified three-dimensional perspectives of stacked memory arrays using the unit memory cell of FIG. 5D according to an aspect of the present invention.

FIG. 5E illustrates a simplified three-dimensional perspective of stacked memory arrays according to an aspect of the present invention. In FIG. 5E, a memory 506 may include a plurality of row conductors 562, a plurality of column conductors 512, a plurality of fuses 532, and a plurality of insulating plugs 542. Again, the memory 506 may include a diode at each memory cell 596, but it is obscured by the row conductors 562. The entire memory 506 may be placed above a substrate 599. In FIG. 5E, three levels of memory array are shown, but in reality, many levels of memory array may exist. In the example of FIG. 5E, N layers of memory and 2N layers of conductors are shown. An alternative configuration has N memory layers for N+1 conductor layers.

Figure 6:
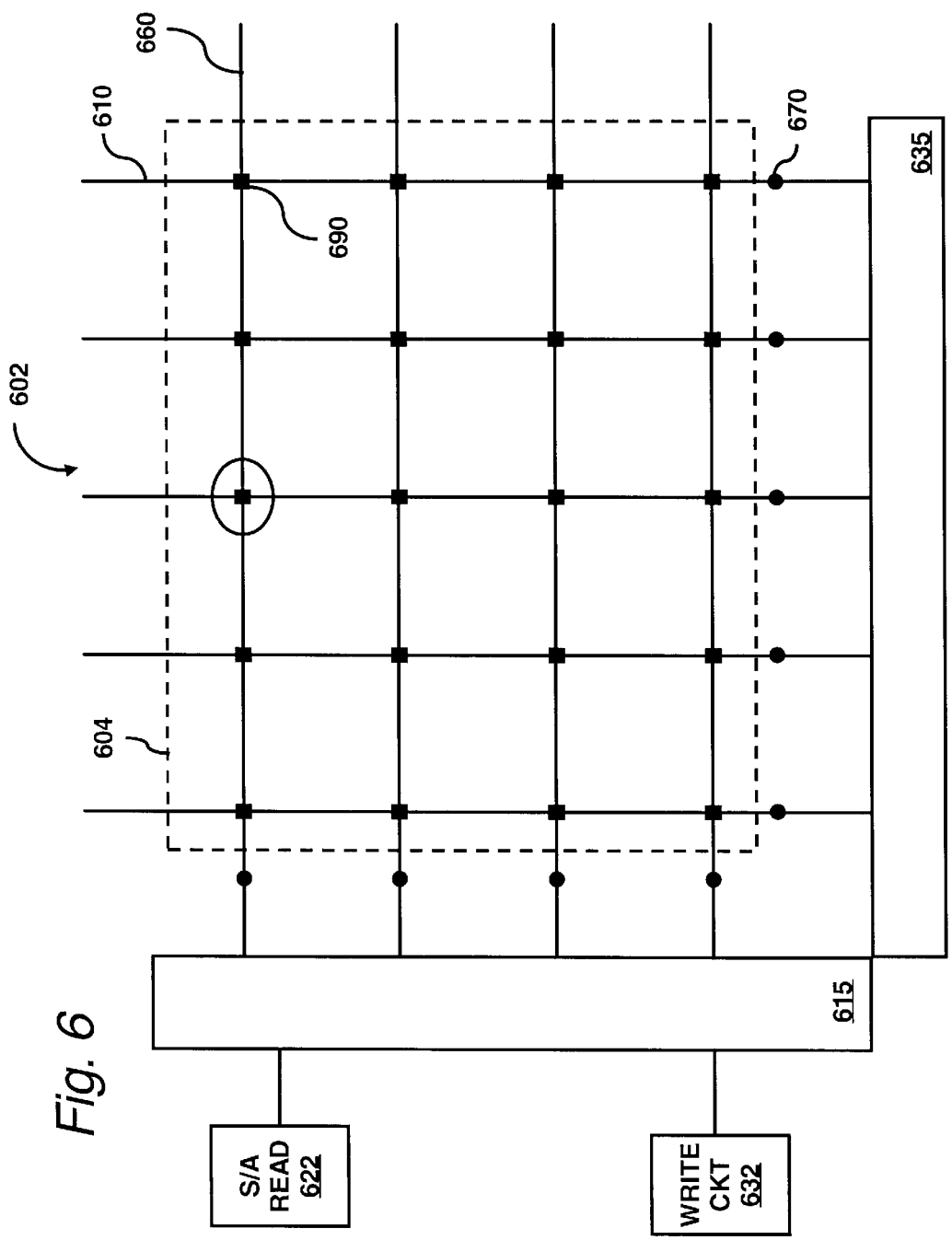
FIG. 6 illustrates a two-dimensional representation of a memory array according to an aspect of the present invention.

FIG. 6 illustrates a two-dimensional representation of a memory device according to an aspect of the present invention is shown. The memory device may include a memory array 604, one or more row conductors 660 and one or more column conductors 610. At intersections (cross-points) between the row and column conductors 660 and 610, state elements 690 are formed. Each state element 690 includes a vertically oriented fuse and a diode in series as discussed previously.

The memory device 602 may also include a row select decoder 615 and a column select decoder 635. Connected to the row select decoder, the memory device 602 may further include a read circuit 622 and a write circuit 632. The row select decoder and column select decoder 635 are used in combination to select a state element 690 (or a bit) or several state elements for reading and writing of data. The read circuit 622 may include at least one sense amplifier ("S/A") to read a single bit or several S/A's to read multiple bits simultaneously. The write circuit 632 may include one or multiple write drivers for writing data to a single bit or multiple bits simultaneously.

It should be noted that the cross-point memory array 604 does not require a silicon substrate. This allows many memory array layers to be fabricated on top of each other. The arrays may be connected to CMOS support circuitries through vias 670. The support circuitries include the row select decoder 615, the column select decoder 635, the read circuit 622 and the write circuit 632. The support circuitries may be fabricated under the cross-point memory array 604. In this manner, the silicon substrate real estate may be more efficiently used and higher memory capacity may be achieved.

The details of programming and reading an individual memory unit cell were discussed above. To program and read the memory, the row and column addressing circuitries 615 and 635 are manipulated to select a particular memory element and deliver critical voltage, and thereby generate a critical current, to the selected memory element in programming mode. Likewise, in reading mode, the row and column addressing circuitries 615 and 635 are manipulated to select a particular memory element and deliver the reading voltage to the selected memory element, and sensing presence or absence of current.

Figure 7:
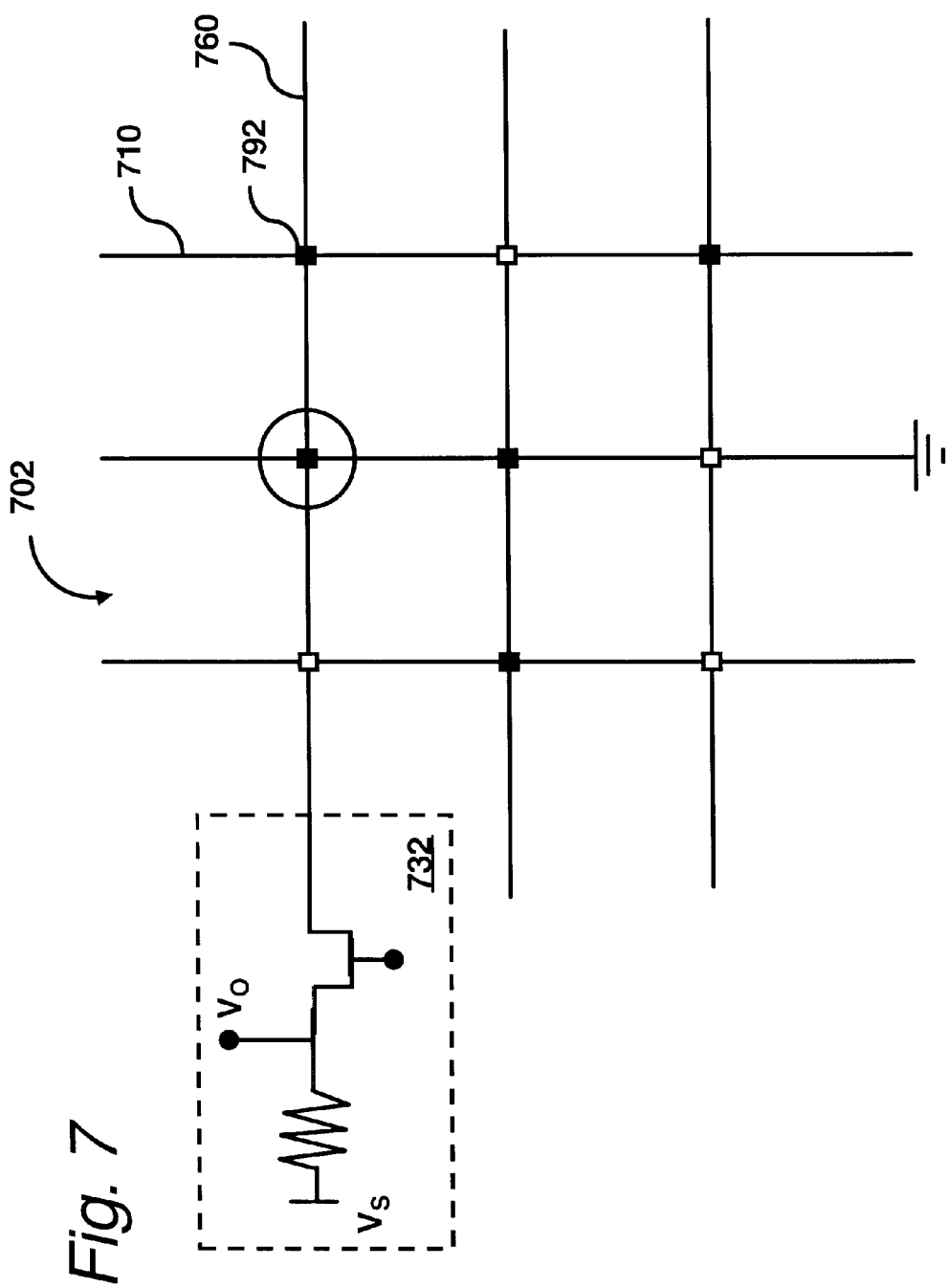
FIG. 7 illustrates a simplified two-dimensional representation of a memory array illustrating a method for reading according to an aspect of the present invention.

An alternative way to read the memory using a simple S/A 732 is illustrated in FIG. 7. In this figure, black state elements 792 indicates a fuse in the first state, e.g. where the fuse is left intact, and the white state elements 792 indicates a fuse in the second state, e.g. where the fuse is blown. In this particular instance, the selected state element is in the first state.

For simplicity, the row and column decoders have been omitted and it is assumed that the row and column decoder circuitries have combined to select the particular state element for reading. If it is assumed that the fuse of the selected state element 792 is left intact, then there is a conductive path to the ground from the supply voltage $V_S$. As a result, current flows from the supply voltage $V_S$ to ground through the fuse and forward biased diode, and a readout voltage $V_O$ will be the diode junction voltage, which is typically about 0.7 volts. However, if the fuse of the selected state element is blown, then the readout voltage $V_O$ will essentially be equal to the supply voltage $V_S$, which can be considerably larger than the diode junction voltage. Other unselected rows and columns may be left floating. Thus in this second way, the presence or absence of current is indirectly detected through reading voltage levels.

While not shown in FIGS. 6 or 7, multiple arrays may be stacked on top of each other to increase the density of the memory. Also, because vertically oriented fuses are used, the lateral area consumption is kept to a minimum, which increases the memory density even further.

While the invention has been described with reference to the exemplary embodiments thereof, those skilled in the art will be able to make various modifications to the described embodiments of the invention without departing from the true spirit and scope of the invention. The terms and descriptions used herein are set forth by way of illustration only and are not meant as limitations. In particular, although the method of the present invention has been described by examples, the steps of the method may be performed in a different order than illustrated or simultaneously. Those skilled in the art will recognize that these and other variations are possible within the spirit and scope of the invention as defined in the following claims and their equivalents.

What is claimed is:

1. A memory cell, comprising:
   a top conductor extending in a first direction;
   a bottom conductor extending in a second direction so as to define a cross-point at an intersection between said top and bottom conductors, said bottom conductor having electrical connectivity with said top conductor;
   a vertically oriented fuse formed in said cross-point having electrical connectivity with said top and bottom conductors, wherein a current flow within said vertically oriented fuse is substantially vertical, wherein said vertically oriented fuse is shaped such that a void exists in said vertically oriented fuse about a center of said vertically oriented fuse; and a diode formed in electrical series with said fuse.

2. The memory cell of claim 1, wherein said vertically oriented fuse substantially occupies a closed region near said cross-point, said memory cell further comprising:
an insulating plug substantially filling said void such that an inner wall of said vertically oriented fuse is bounded by said insulating plug; and
an insulator formed around a perimeter of said closed region such that an outer wall of said vertically oriented fuse is bounded by said insulator.

3. The memory cell of claim 1, wherein a vertical height to lateral thickness ratio of said vertically oriented fuse is unity or greater.

4. The memory cell of claim 1, wherein said vertically oriented fuse substantially occupies a closed region near said cross-point, said memory cell further comprising:
a thin conductor formed in said closed region between said vertically oriented fuse and diode.

5. The memory cell of claim 1, wherein said vertically oriented fuse extends in one of said first and second directions.

6. The memory cell of claim 5, further comprising:
an insulator formed at an exterior region of said vertically oriented fuse; and
an insulating plug formed at an interior region of said vertically oriented fuse substantially filling said void.

7. The memory cell of claim 5, further comprising
a thin conductor formed between said diode and said vertically oriented fuse.

8. The memory cell of claim 1, wherein;
said diode contains at least one of amorphous and polycrystalline Si, Ge, and Ge—Si.

9. The memory cell of claim 1, wherein said vertically oriented fuse is made of at least one of Si, Ge, Al, Cu, Ag, Au, Pt, In, Zn, Sn, Pb, Ta, W, Ni, Cr and any alloys thereof.

10. A one-time programmable memory array, comprising:
one or more row conductors extending in a row direction;
one or more column conductors extending in a column direction such that a cross-point is formed at each intersection between said row and column conductors; and
a state element formed in at least one cross-point, wherein said state element includes a vertically oriented fuse and a diode in series with each other, wherein a current flow within said vertically oriented fuse is substantially vertical, wherein said vertically oriented fuse is shaped such that a void exists in said vertically oriented fuse about a center of said vertically oriented fuse, and said state element is in electrical contact with said row and column conductors.

11. The memory array of claim 10, further comprising:
an insulator surrounding said state element.

12. The memory array of claim 10, wherein said state element further comprises:
a thin conductor placed in between said vertically oriented fuse and said diode.

13. The memory array of claim 10, wherein:
said vertically oriented fuse of said state element extends along one of said row and column directions.

14. A one-time programmable memory, comprising:
one or more memory arrays, each memory array comprising:
one or more row conductors extending in a row direction;
one or more column conductors extending in a column direction such that a cross-point is formed at each intersection between said row and column conductors; and
a state element formed in at least one cross-point, wherein said state element includes a vertically oriented fuse and a diode in series with each other, wherein a current flow within said vertically oriented fuse is substantially vertical, wherein said vertically oriented fuse is shaped such that a void exists in said vertically oriented fuse about a center of said vertically oriented fuse, and said state element is in electrical contact with said row and column conductors;
a row addressing circuitry connected to each of said row conductors for selecting a row of said memory array within said memory; and
a column addressing circuitry connected to each of said column conductors for selecting a column of said memory array within said memory.

15. The memory of claim 14, wherein:
said row and column addressing circuitries associated with said memory array within said memory is at least partially located beneath said memory array.

16. The memory of claim 14, wherein:
said memory arrays are stacked.

17. The memory of claim 16, wherein:
a number of row and column conductor layers combined is one greater than a number of said memory arrays.

18. The memory of claim 16, wherein:
a number of row and column conductor layers combined is twice a number of said memory arrays.

19. The memory array of claim 10, wherein said vertically oriented fuse substantially occupies a closed region near said at least one cross-point, said state element further comprising:
an insulating plug substantially filling said void such that an inner wall of said vertically oriented fuse is bounded by said insulating plug; and
an insulator formed around a perimeter of said closed region such that an outer wall of said vertically oriented fuse is bounded by said insulator.

20. The memory array of claim 10, wherein a vertical height to lateral thickness ratio of said vertically oriented fuse is unity or greater.

21. The memory array of claim 13, further comprising:
an insulator formed at an exterior region of said vertically oriented fuse; and
an insulating plug formed at an interior region of said vertically oriented fuse substantially filling said void.

22. The memory array of claim 13, further comprising
a thin conductor formed between said diode and said vertically oriented fuse.

23. The memory of claim 14, wherein said vertically oriented fuse substantially occupies a closed region near said at least one cross-point, said state element further comprising:
an insulating plug substantially filling said void such that an inner wall of said vertically oriented fuse is bounded by said insulating plug; and
an insulator formed around a perimeter of said closed region such that an outer wall of said vertically oriented fuse is bounded by said insulator.

24. The memory of claim 14, wherein a vertical height to lateral thickness ratio of said vertically oriented fuse is unity or greater.

25. The memory of claim 14, wherein said vertically oriented fuse substantially occupies a closed region near said at least one cross-point, said state element further comprising:

a thin conductor formed in said closed region between said vertically oriented fuse and diode.

26. The memory of claim 14, wherein:

said vertically oriented fuse of said state element extends along one of said row and column directions.

27. The memory of claim 26, further comprising:

an insulator formed at an exterior region of said vertically oriented fuse; and an insulating plug formed at an interior region of said vertically oriented fuse substantially filling said void.

28. The memory of claim 26, further comprising a thin conductor formed between said diode and said vertically oriented fuse.

29. A memory cell, comprising:

a top conductor extending in a first direction;

a bottom conductor extending in a second direction so as to define a cross-point at an intersection between said top and bottom conductors, said bottom conductor having electrical connectivity with said top conductor;

a vertically oriented fuse formed in said cross-point having electrical connectivity with said top and bottom conductors, wherein said vertically oriented fuse substantially occupies a closed region near said cross-point;

an insulating plug substantially occupying a center of said closed region such that an inner wall of said vertically oriented fuse is bounded by said insulating plug;

an insulator formed around a perimeter of said closed region such that an outer wall of said vertically oriented fuse is bounded by said insulator; and a diode formed in electrical series with said vertically oriented fuse.

* * * * *